(12) United States Patent
Thomas et al.

(10) Patent No.: US 10,188,001 B2
(45) Date of Patent: Jan. 22, 2019

(54) METHODS OF FORMING HIGH ASPECT RATIO PLATED THROUGH HOLES AND HIGH PRECISION STUB REMOVAL IN A PRINTED CIRCUIT BOARD

(71) Applicant: Sanmina Corporation, San Jose, CA (US)

(72) Inventors: Douglas Ward Thomas, Pacific Grove, CA (US); Shinichi Iketani, Sunnyvale, CA (US); Dale Kersten, Ben Lomond, CA (US)

(73) Assignee: SANMINA CORPORATION, San Jose, CA (US)

( * ) Notice: Subject to any disclaimer, the term of this patent is extended or adjusted under 35 U.S.C. 154(b) by 589 days.

(21) Appl. No.: 14/603,191

(22) Filed: Jan. 22, 2015

(65) Prior Publication Data

US 2015/0208514 A1 Jul. 23, 2015

Related U.S. Application Data

(60) Provisional application No. 61/930,456, filed on Jan. 22, 2014.

(51) Int. Cl.
*H05K 3/42* (2006.01)
*H05K 1/02* (2006.01)
*H05K 3/24* (2006.01)

(52) U.S. Cl.
CPC .......... *H05K 3/429* (2013.01); *H05K 1/0216* (2013.01); *H05K 3/24* (2013.01);
(Continued)

(58) Field of Classification Search
CPC ........ H05K 1/0216; H05K 3/24; H05K 3/429; H05K 2201/09845; H05K 2203/0207;
(Continued)

(56) References Cited

U.S. PATENT DOCUMENTS

| 7,337,537 B1 * | 3/2008 | Smetana, Jr. .......... H05K 3/429 29/846 |
| 2004/0150487 A1 * | 8/2004 | Tabatabai ................ H01P 3/003 333/5 |

(Continued)

FOREIGN PATENT DOCUMENTS

| CN | 1857042 A | 11/2006 |
| CN | 101060757 A | 10/2007 |

(Continued)

OTHER PUBLICATIONS

International Search Report and Written Opinion for PCT/US15/12523 dated Jun. 25, 2015; 6 pages.

*Primary Examiner* — Ciel P Thomas
(74) *Attorney, Agent, or Firm* — Loza & Loza, LLP; Julio M. Loza; Heidi L. Eisenhut

(57) ABSTRACT

The present invention relates to printed circuit boards (PCBs), and more particularly, to methods of forming high aspect ratio through holes and high precision stub removal in a printed circuit board (PCB). The high precision stub removal processes may be utilized in removing long stubs and short stubs. In the methods, multiple holes of varying diameter and depth are drilled from an upper and/or lower surface of the printed circuit board utilizing drills of different diameters.

13 Claims, 30 Drawing Sheets

(52) U.S. Cl.
CPC ............ *H05K 2201/09845* (2013.01); *H05K 2203/0207* (2013.01); *H05K 2203/0242* (2013.01); *H05K 2203/072* (2013.01); *H05K 2203/0723* (2013.01)

(58) Field of Classification Search
CPC ..... H05K 2203/0242; H05K 2203/072; H05K 2203/0723
See application file for complete search history.

(56) References Cited

U.S. PATENT DOCUMENTS

| | | |
|---|---|---|
| 2006/0278429 A1 | 12/2006 | Tourne et al. |
| 2009/0045889 A1 | 2/2009 | Goergen et al. |
| 2009/0166078 A1* | 7/2009 | Matsui .................. H05K 1/184 |
| | | 174/262 |
| 2009/0288874 A1 | 11/2009 | Dudnikov, Jr. et al. |
| 2012/0234587 A1 | 9/2012 | Nakamura et al. |
| 2013/0330941 A1* | 12/2013 | Jeon ..................... H01R 12/585 |
| | | 439/65 |

FOREIGN PATENT DOCUMENTS

| | | |
|---|---|---|
| CN | 101861058 A | 10/2010 |
| CN | 101925253 A | 12/2010 |
| RU | 2141152 C1 | 11/1999 |

* cited by examiner

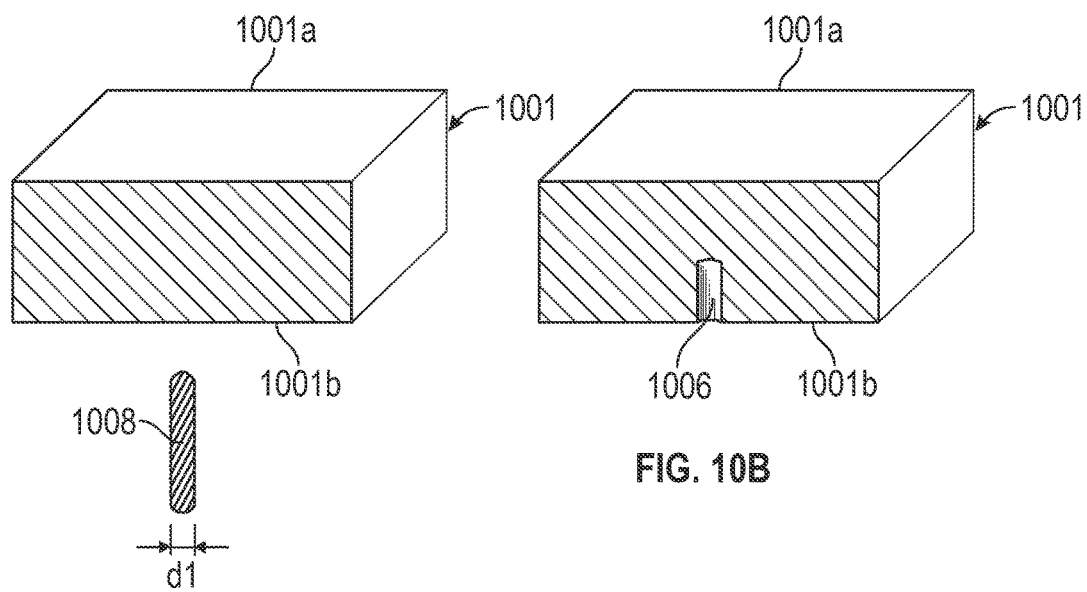
FIG. 10A
FIG. 10B
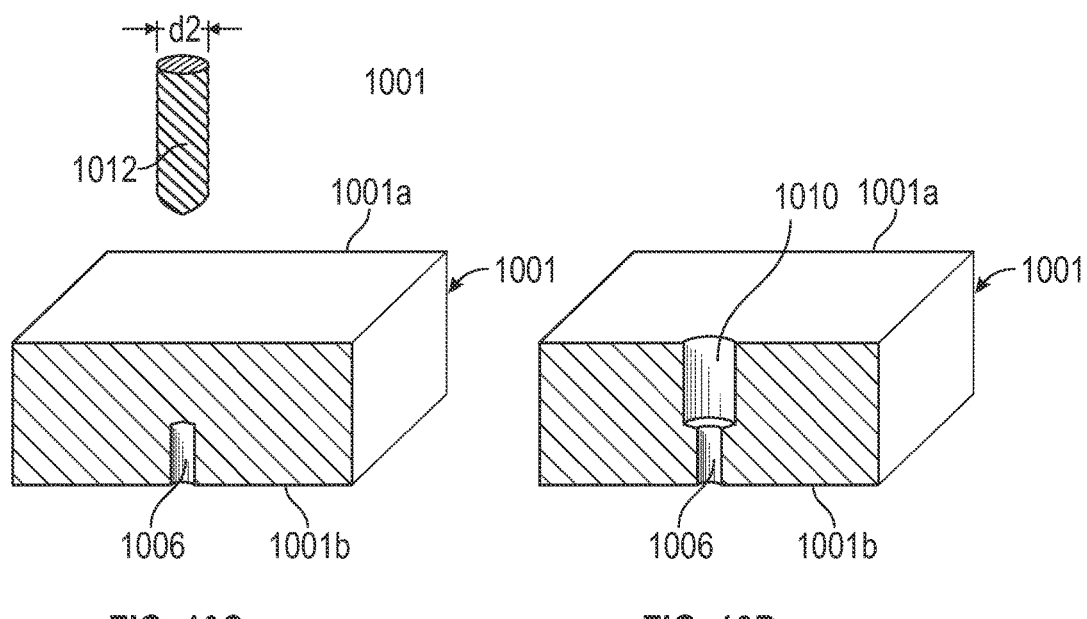
FIG. 10C
FIG. 10D

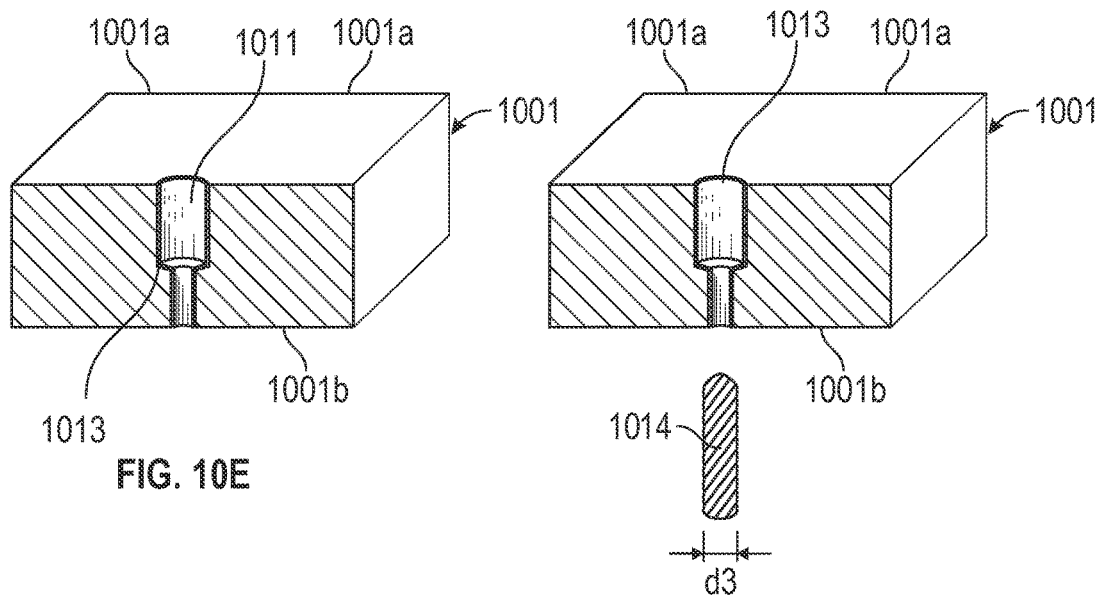
FIG. 10E
FIG. 10F
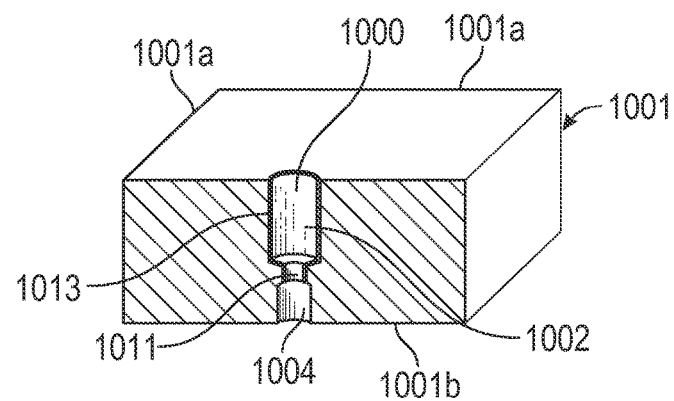
FIG. 10G

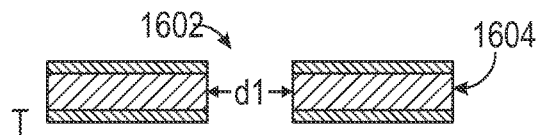
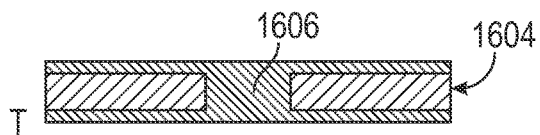
FIG. 16A    FIG. 16B
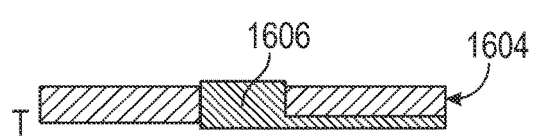
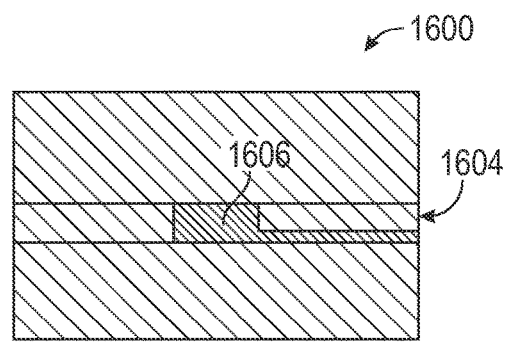
FIG. 16C    FIG. 16D
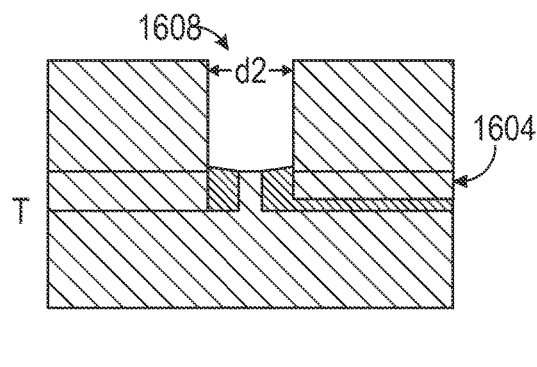
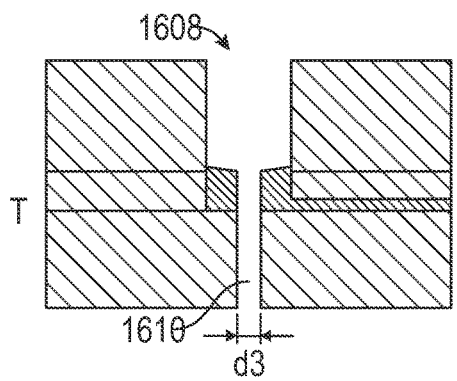
FIG. 16E    FIG. 16F
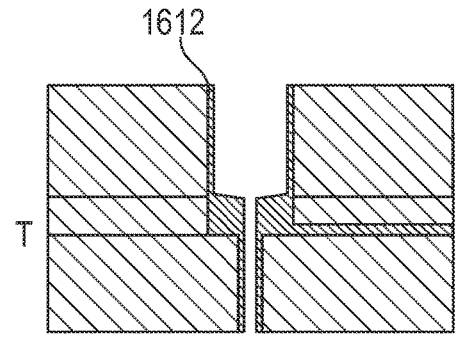
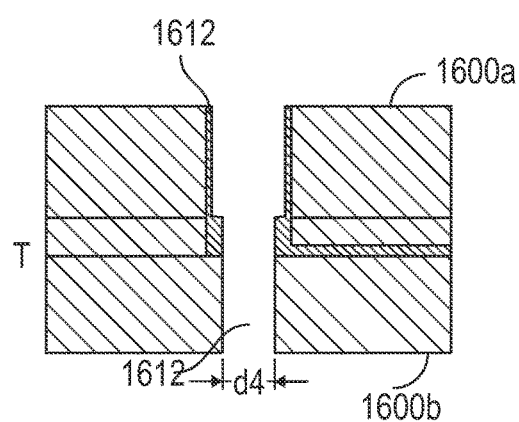
FIG. 16G    FIG. 16H

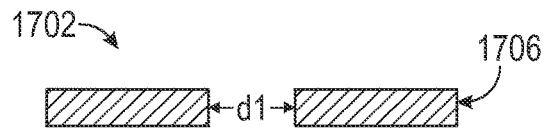
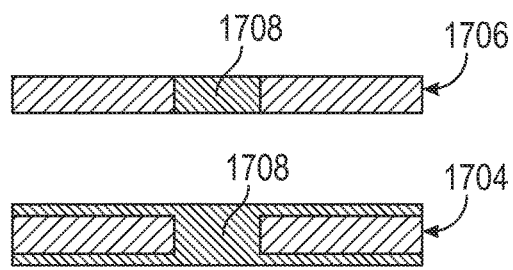
FIG. 17A      FIG. 17B
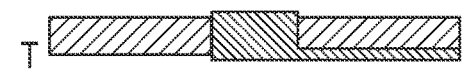
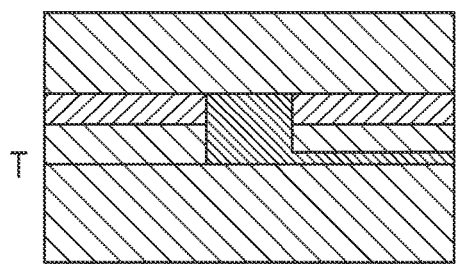
FIG. 17C      FIG. 17D
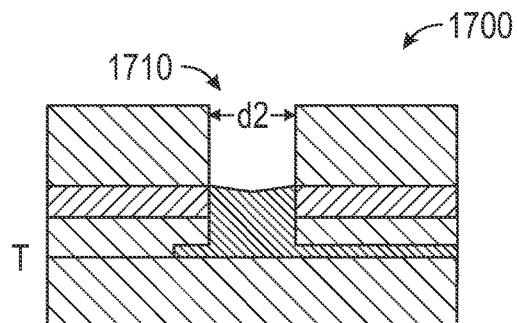
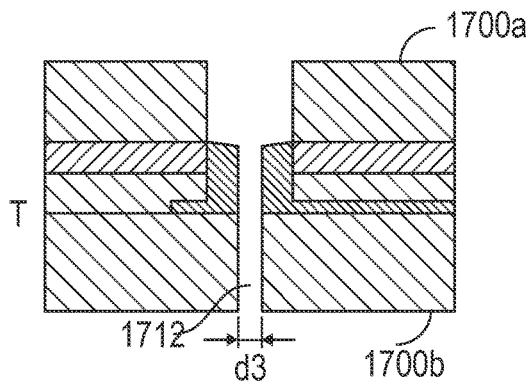
FIG. 17E      FIG. 17F

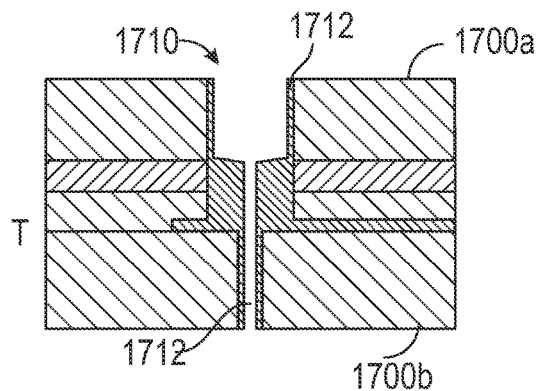
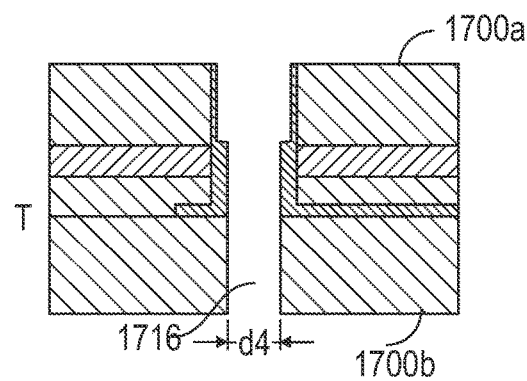
FIG. 17G  FIG. 17H
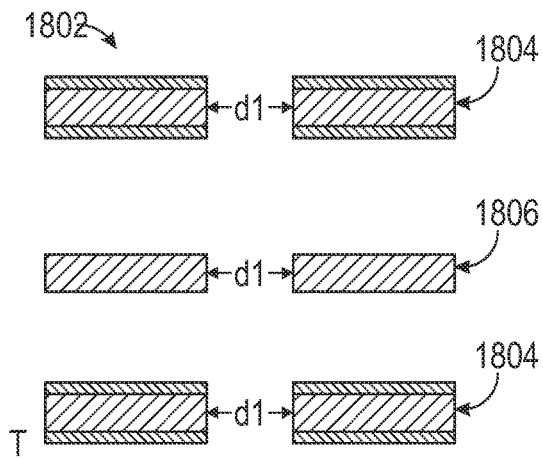
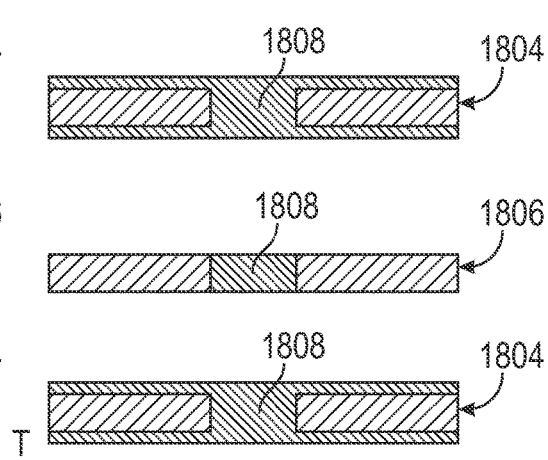
FIG. 18A  FIG. 18B
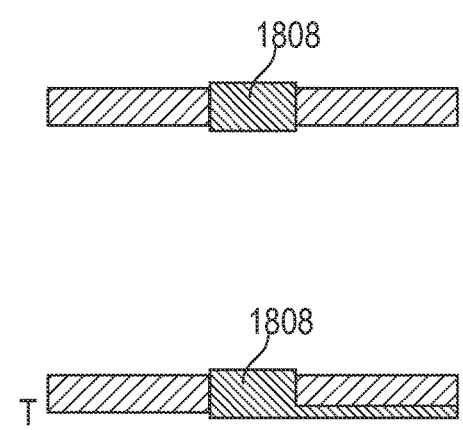
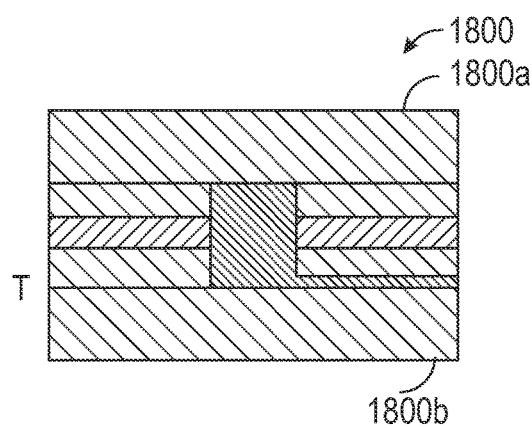
FIG. 18C  FIG. 18D

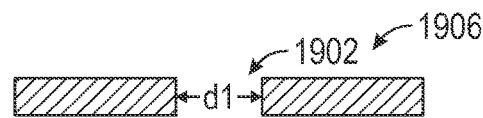
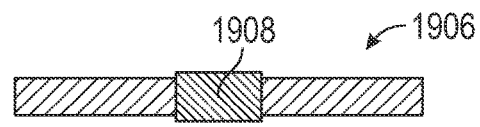
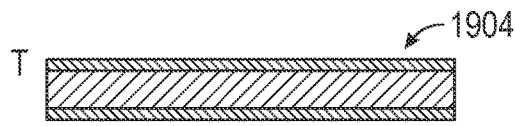
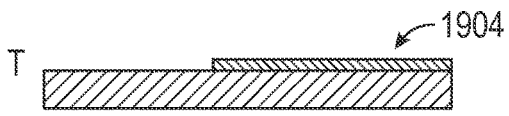
FIG. 19A
FIG. 19B
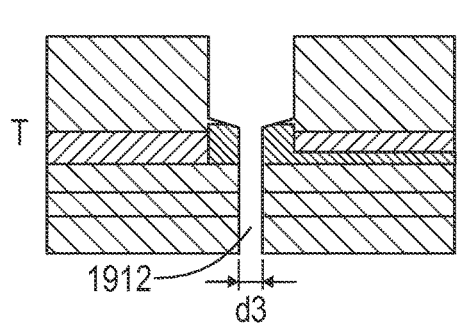
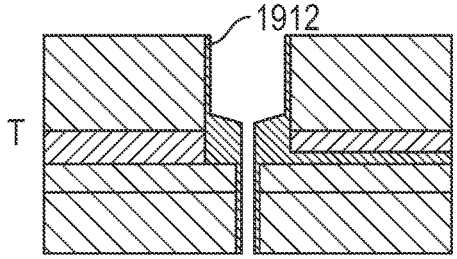
FIG. 19E
FIG. 19F
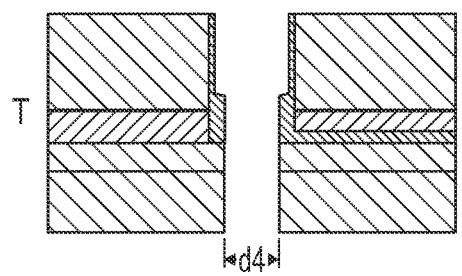
FIG. 19G

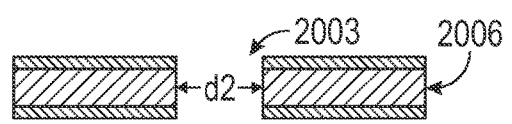
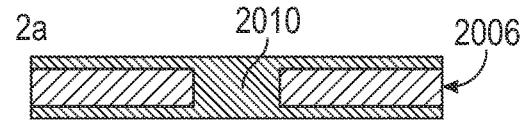
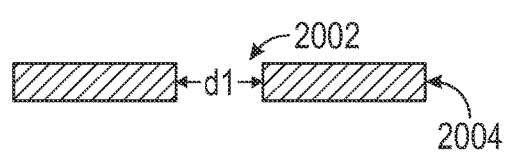
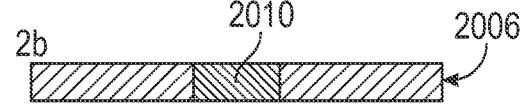
FIG. 20A
FIG. 20B
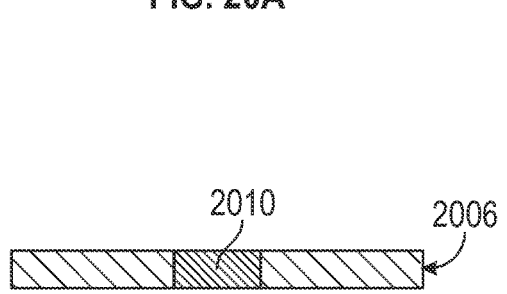
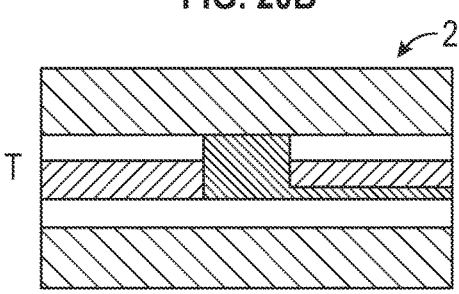
FIG. 20C
FIG. 20D
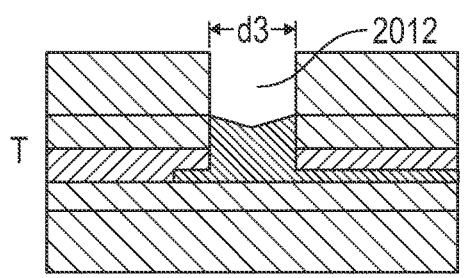
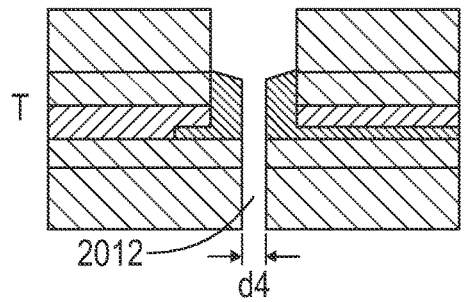
FIG. 20E
FIG. 20F
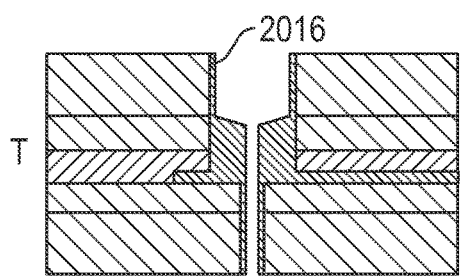
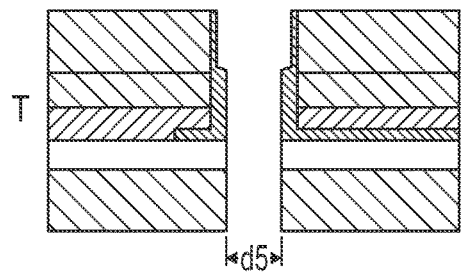
FIG. 20G
FIG. 20H

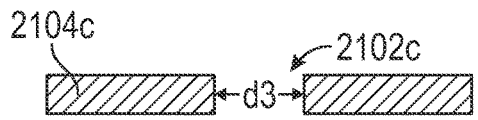
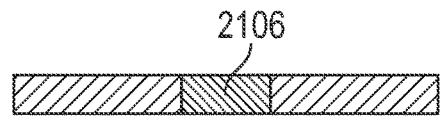
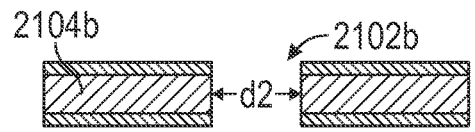
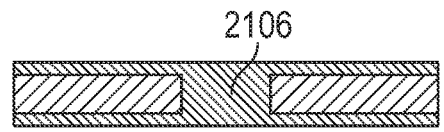
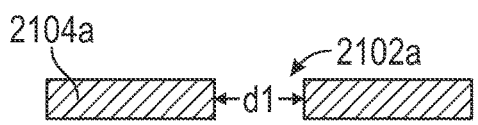
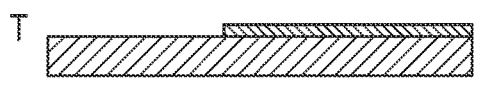
FIG. 21A
FIG. 21B
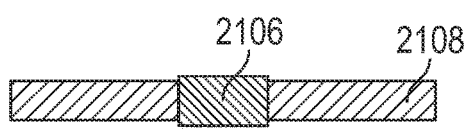
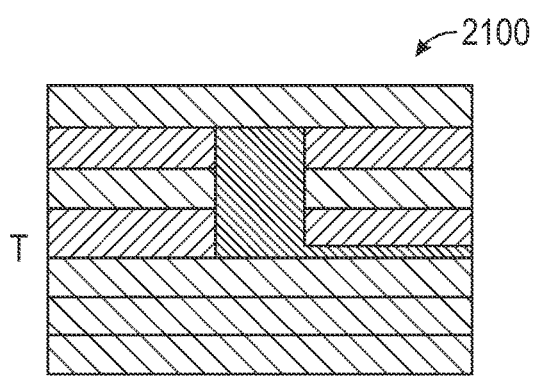
FIG. 21C
FIG. 21D

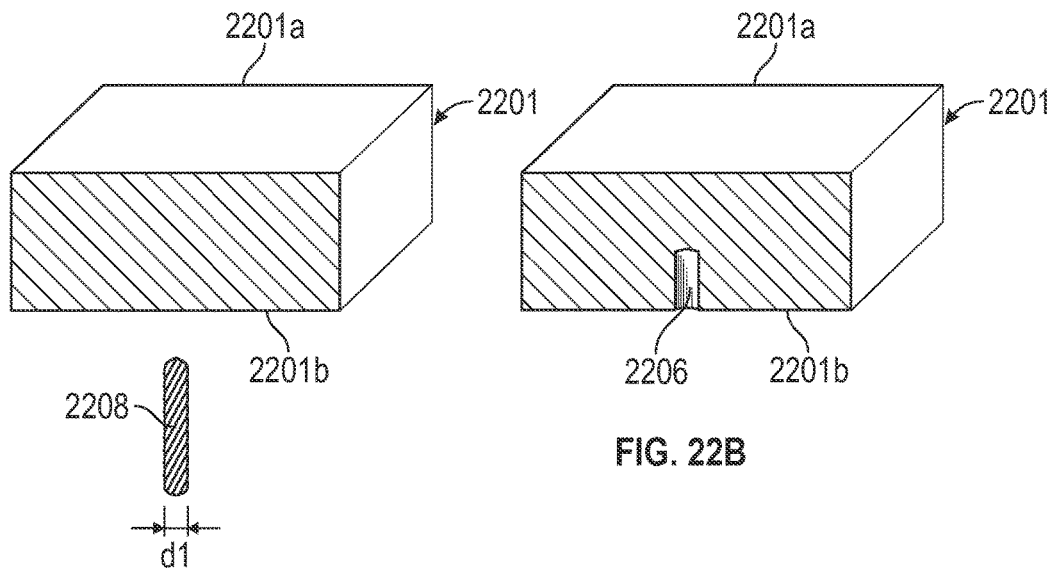
FIG. 22A
FIG. 22B
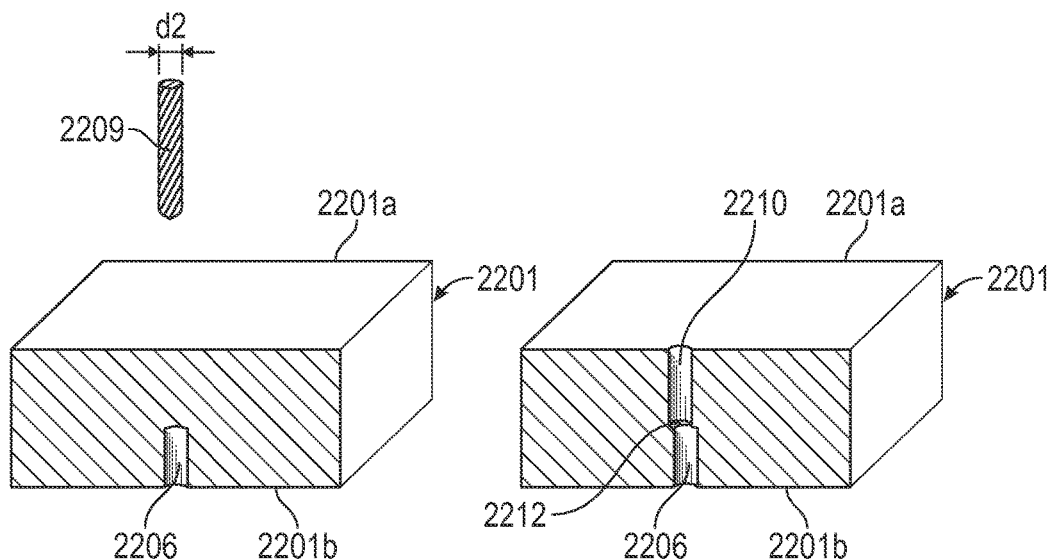
FIG. 22C
FIG. 22D

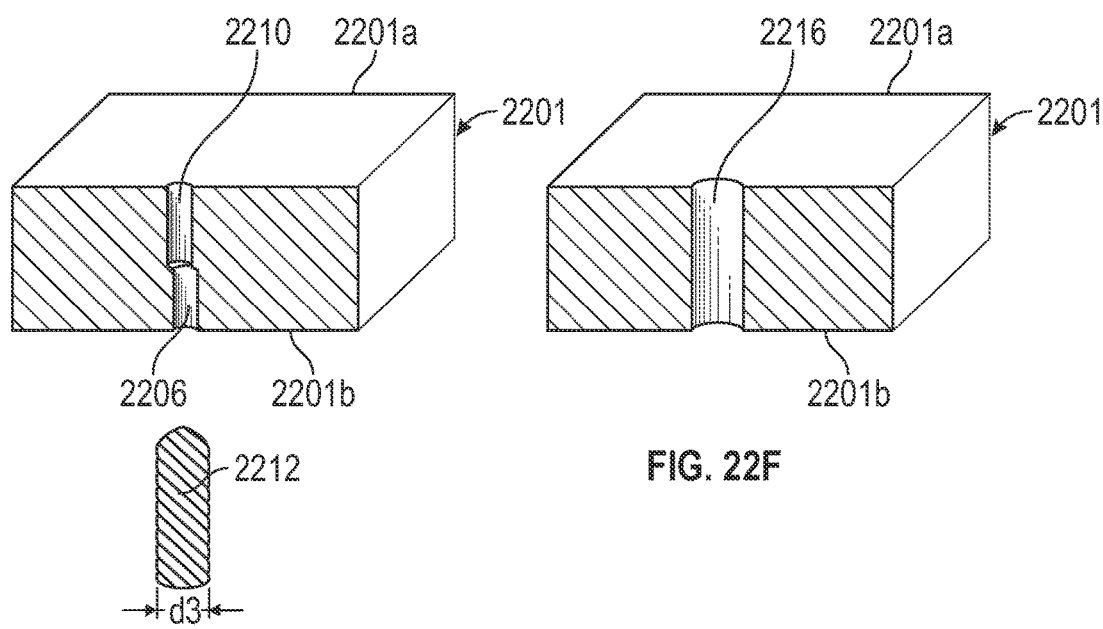
FIG. 22E
FIG. 22F
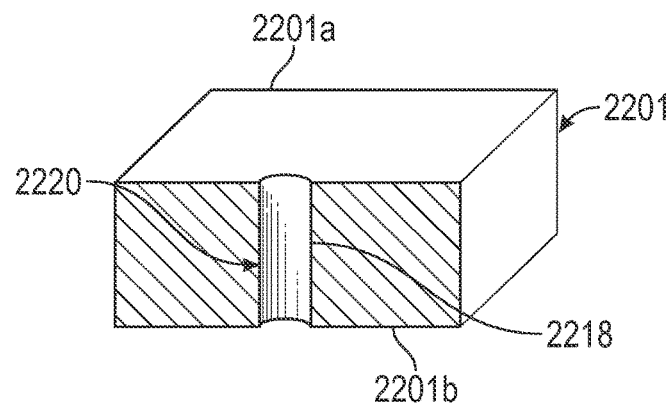
FIG. 22G

METHODS OF FORMING HIGH ASPECT RATIO PLATED THROUGH HOLES AND HIGH PRECISION STUB REMOVAL IN A PRINTED CIRCUIT BOARD

CLAIM OF PRIORITY UNDER 35 U.S.C. § 119

The present Application for Patent claims priority to U.S. Provisional Application No. 61/930,456 entitled "METHODS OF FORMING HIGH ASPECT RATIO PLATED THROUGH HOLES AND HIGH PRECISION STUB REMOVAL IN A PRINTED CIRCUIT BOARD", filed Jan. 22, 2014, assigned to the assignee hereof and hereby expressly incorporated by reference herein.

FIELD OF THE INVENTION

The present invention relates to printed circuit boards (PCBs), and more particularly, to methods of forming high aspect ratio through holes and high precision stub removal in a printed circuit board (PCB).

BACKGROUND

Consumers are increasingly demanding both faster and smaller electronic products. The use of PCBs has grown enormously as new electronic applications are marketed. A PCB is formed by laminating a plurality of conducting layers with one or more non-conducting layers. As the size of a PCB shrinks, the relative complexity of its electrical interconnections grows.

A via structure is traditionally used to allow signals to travel between layers of a PCB. The plated via structure is a plated hole within the PCB that acts as a medium for the transmission of an electrical signal. For example, an electrical signal may travel through a trace on one layer of the PCB, through the plated via structure's conductive material, and then into a second trace on a different layer of the PCB.

Unfortunately, due to limitations within the prior art, the plated via structure may be longer than necessary to perform the function of electrical connectivity. For example, the plated via structure may extend completely through the PCB but only connect two traces on two proximate adjacent layers. As a result, one or more stubs may be formed. A stub is excessive conductive material within the plated via structure which is not necessary to transport the electrical signal.

When a high speed signal is transmitted through the plated via structure, a "stub effect" may distort the signal. The stub effect is a result of the useless excess conductive material present within the plated via structure. The stub effect occurs when a portion of the signal is diverted away from the trace connections and into one or more stubs of the plated via structure. The portion of the signal may be reflected from the end of the stub back toward the trace connections after some delay. This delayed reflection may interfere with signal integrity and increase, for example, the bit error rate of the signal. The degenerating effect of the stub effect may increase with the length of the stub.

FIGS. 1A-1E illustrate the typical stages of forming back-drilled hole in a printed circuit board (PCB). As shown, the PCB 100 includes stacked material insulator layers (typically laminates and prepregs) 104a, 104b . . . 104f separating five internal layers 105a, 105b . . . 105e and two external layers 108a and 108b. The internal layers 105a, 105b and 105e are signal layers and the internal layers 105c and 105d are plane layers. The PCB 100 has an upper surface 110a and an opposing lower surface 110b.

To form the plated through hole 101 as illustrated in FIG. 1E, a first hole 102 having a first diameter d1 is drilled through the PCB 100 (see FIG. 1A). Next, a second hole 103 having a second diameter d2 is drilled concentrically around and through a predetermined depth of the first hole 102 (see FIG. 1B). Then, the walls of the remaining portion of the first hole 102 and the walls of the second hole 103 are plated with a thin layer of a conductive material 106 (e.g., copper). (See FIG. 1C).

Next, a drill 112 having a diameter d3 is used to back-drill and form a third hole 104 concentrically around and through the remaining portion of the plated first hole 402 starting from the lower surface 110b of the printed circuit board 100 (see FIG. 1D). Then the drill 112 is removed from the printed circuit board 100 which now has the via 101 formed therein that includes a first through hole 107 (e.g., plated second hole 103) and a back-drilled hole 109 (e.g., third hole 104) (see FIG. 1E).

However, when back-drilling the drill bit has no pressure and it pushes up against the traces on the top and as a result fluctuating is created as well as peel off of the conductive plating occurs. (See FIGS. 1D-1E) Consequently, there is a need for improved methods for removing stubs when forming plated through holes in a PCB.

SUMMARY

The following presents a simplified summary of one or more implementations in order to provide a basic understanding of some implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

According to one aspect, a method for forming a plated through hole in a printed circuit board is provided. The method includes drilling a first hole having a first diameter through an upper surface of the printed circuit board; drilling a second hole having a second diameter through the first hole to a lower surface of the printed circuit board, the lower surface opposite the upper surface; plating the first hole and the second hole with a conductive material; and drilling a third hole having a third diameter through the first hole and the second hole. The printed circuit board includes a plurality of plated through holes formed therein.

In one example, the first hole is drilled a predetermined depth and the predetermined depth is shorter than half the vertical distance of the printed circuit board. The second diameter is smaller than the first diameter, and the third diameter is larger than the second diameter and smaller than the first diameter. The third hole is drilled from the upper surface to the lower surface of the printed circuit board.

In another example, the second diameter is larger than the first diameter, and the third diameter is larger than the second diameter and smaller than the first diameter.

In yet another example, the second diameter is smaller than the first diameter; a top of the third hole to a bottom of the second hole remains undrilled; and the third diameter is larger than the second diameter.

In yet another example, the method further includes adding copper to any remaining conductive surface by electrolytic plating.

In yet another example, the second diameter is smaller than the first diameter; a top of the third hole to a bottom of the first hole remains undrilled; and the third diameter is larger than the second diameter. The method further includes adding copper to any remaining conductive surface by electrolytic plating.

In yet another example, the method further includes embedding a first conductive material in the printed circuit board According to another aspect, a method for forming a plated through hole in a printed circuit board is provided. The method includes drilling a first hole having a first diameter from a lower surface of the printed circuit board; drilling a second hole having a second diameter through an upper surface of the printed circuit board to the first hole of the printed circuit board, the upper surface opposite the lower surface; plating the first hole and the second hole with a conductive material; and drilling a third hole having a third diameter through the first hole and the second hole. The printed circuit board has a plurality of plated through holes formed therein.

According to one example, the second hole is drilled a predetermined depth; and the predetermined depth is shorter than half the vertical distance of the PCB. The second diameter is larger than the first diameter; and the third diameter is larger than the second diameter and smaller than the first diameter. The third hole is drilled from the upper surface to the lower surface of the printed circuit board.

According to another example, the second diameter is larger than the first diameter; and the third diameter is smaller than the second diameter and larger than the first diameter.

According to yet another example, the second diameter is larger than the first diameter; a top of the third hole to a bottom of the second hole remains undrilled; and the third diameter is larger than the first diameter.

According to yet another example, the method further includes adding copper to any remaining conductive surface by electrolytic plating.

According to yet another example, the first hole is drilled a predetermined depth; and the predetermined depth is shorter than half the vertical distance of the printed circuit board. The method further includes plating the third hole with a conductive material forming a plated through hole; wherein the second hole is drilled to a top of the first hole; and the third diameter is larger than the first diameter and the second diameter.

According to yet another example, a method for forming a plated through hole in a printed circuit board, including a first surface and an opposing second surface, is provided. The method includes embedding a first conductive material in the printed circuit board; drilling a first hole having a first diameter from a first surface of the printed circuit board to a first predetermined depth; drilling a second hole having a second diameter through the first hole to a second predetermined depth, plating the first hole and the second hole with a second conductive material; and drilling a third hole having a third diameter through the first hole and the second hole. The printed circuit board has a plurality of plated through holes formed therein; and wherein the conductive material is copper.

According to one example, the first surface is an upper surface and the second surface is a lower surface; the first predetermined depth is from the upper surface to the embedded first conductive material; the second predetermined depth is from the first surface to the second surface; wherein second diameter is smaller than the first diameter; and the third diameter is larger than the second diameter and smaller than the first diameter.

According to another example, the first surface is a lower surface and the second surface is an upper surface; the first predetermined depth is from the lower surface through the embedded first conductive material; the second predetermined depth is from the first surface to the first hole of the printed circuit board; and the second diameter is smaller than the first diameter; and the third diameter is larger than the second diameter and smaller than the first diameter.

According to yet another example, the first surface is a lower surface and the second surface is an upper surface; the first predetermined depth is from the lower surface through the embedded first conductive material; the second predetermined depth is from the first surface to the first hole of the printed circuit board; and the second diameter is smaller than the first diameter; and the third diameter is larger than the first diameter and smaller than the second diameter.

According to yet another example, the first surface is a lower surface and the second surface is an upper surface; the first predetermined depth is from the lower surface through the embedded first conductive material; the second predetermined depth is from the upper surface to the printed circuit board through the embedded first conductive material; the second diameter is smaller than the first diameter; and the third diameter is smaller than the second diameter and larger than the second diameter.

According to yet another example, the method includes adding copper to any remaining conductive surface by electrolytic plating.

BRIEF DESCRIPTION OF THE DRAWINGS

FIGS. 10A-10G are illustrations of the different fabrication stages for forming a plated through hole (or via) and removal of a short stub in a printed circuit board (PCB), according to one aspect.

FIGS. 11A1, 11A2, 11B-1, 11B-2, 11C and 11D are illustrations of the different fabrication stages for forming a plated through hole (or via) and removal of a short stub in a printed circuit board (PCB), according to one aspect.

FIGS. 16A-16H illustrate the different fabrication stages for forming a plated through hole (or via) using different diameter drills within a PCB and a conductive material filled core having a connecting inner layer trace (target layer) for forming a via without a stub, according to one aspect.

FIGS. 17A-17H illustrate the different fabrication stages for forming a plated through hole (or via) using different diameter drills within a PCB and a conductive material filled core having a connecting inner layer trace (target layer) and adjacent conductive material filled prepreg for forming a via without a stub, according to one aspect.

FIGS. 18A-18H illustrate of the different fabrication stages for forming a plated through hole (or via) using different diameter drills within a PCB having a conductive material filled prepreg between conductive material filled cores; and having a connecting inner layer trace (target layer) for forming a via without a stub, according to one aspect.

FIGS. 19A-19G illustrate different fabrication stages for forming a plated through hole (or via) using different diameter drills within a PCB having a conductive material filled prepreg and solid core as well as having a connecting inner layer trace (target layer) for forming a via without a stub, according to one aspect.

FIGS. 20A-20H illustrate different fabrication stages for forming a plated through hole (or via) using different diameter drills within a PCB having a conductive material filled prepreg between a conductive material filled core and a solid core; and a connecting inner layer trace (target layer) for forming a via without a stub, according to one aspect.

FIGS. 21A-21H illustrate different fabrication stages for forming a plated through hole (or via) using different diameter drills within a PCB and multiple conductive material filled cores having a connecting inner layer trace (target layer) and adjacent conductive material filled prepregs for forming a via without a stub, according to one aspect.

FIGS. 22A-22G are illustrations of the different fabrication stages for forming a plated through hole (or via) having a high aspect ratio in a printed circuit board (PCB).

DETAILED DESCRIPTION OF THE INVENTION

While the present disclosure provides methods for forming plated through holes in multi-layer printed circuit boards, the present disclosure is not restricted to us in PCBs. A multilayer PCB can be a package substrate, a motherboard, a line card, a puddle card, a backplane, a midplane, a flex or rigid flex circuit. A via structure can be a plated through hole (PTH) used for transmitting electrical signals from one conducting layer to another. A plated via structure can also be a component mounting hole for electrically connecting an electrical component to other electrical components on the PCB.

Removal of Long Stub

FIGS. 2A1, 2A2 and 2B-2D illustrate the different fabrication stages for forming a plated through hole (or via) and removal of a long stub in a printed circuit board (PCB), according to one aspect. As described below, the final drill direction prevents the peeling up of the cutting edge of the plated corner.

The location where a signal is transmitted through the PTH, or where a first layer 202 is connected to a second layer 204 in the PCB 200, may be represented as a target layer (T). According to one aspect, the first layer 202 may include a hole 206 drilled using a long depth drill while the second layer 204 may include an upper hole 203 drilled using a short depth drill. The long depth drill has a length that is less than or equal to the distance from the bottom of the first layer 202 to the target layer T prior to plating.

Figure 1A:
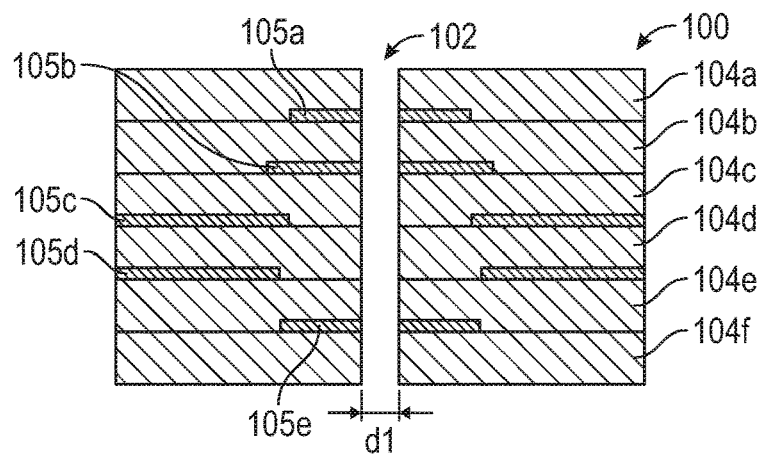
FIGS. 1A-1E illustrate the typical stages of forming back-drilled hole in a PCB.
Figure 1B:
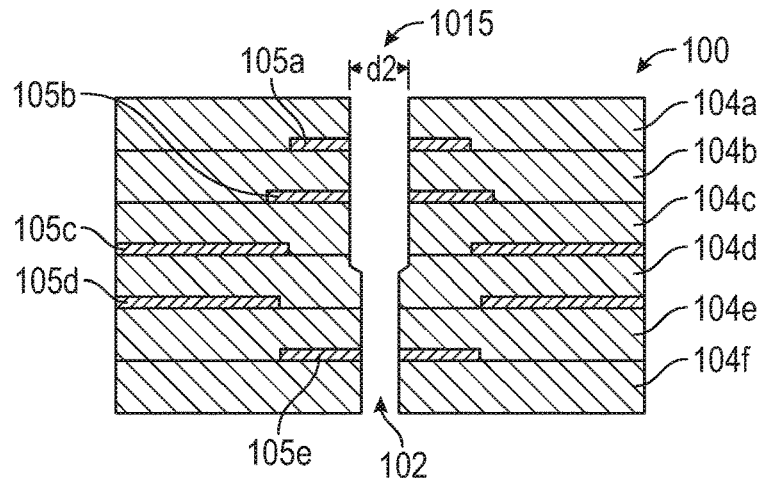
Figure 1C:
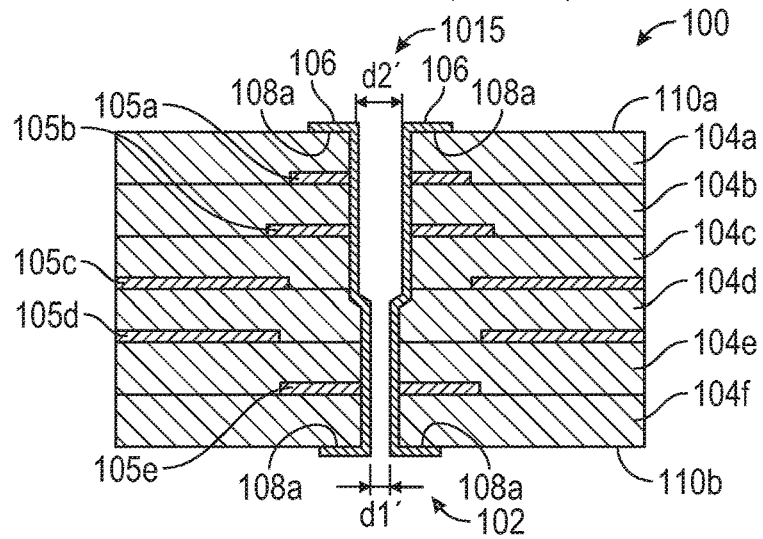
Figure 1D:
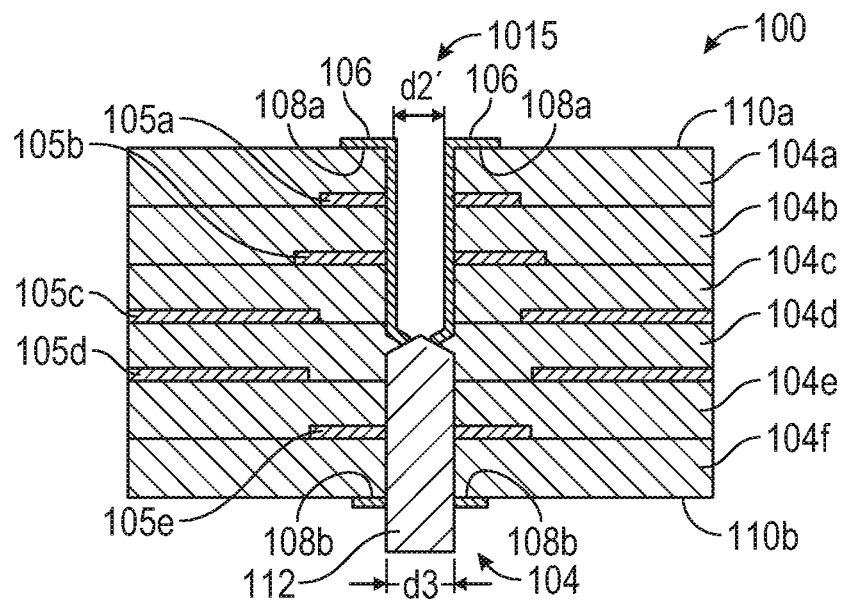
Figure 1E:
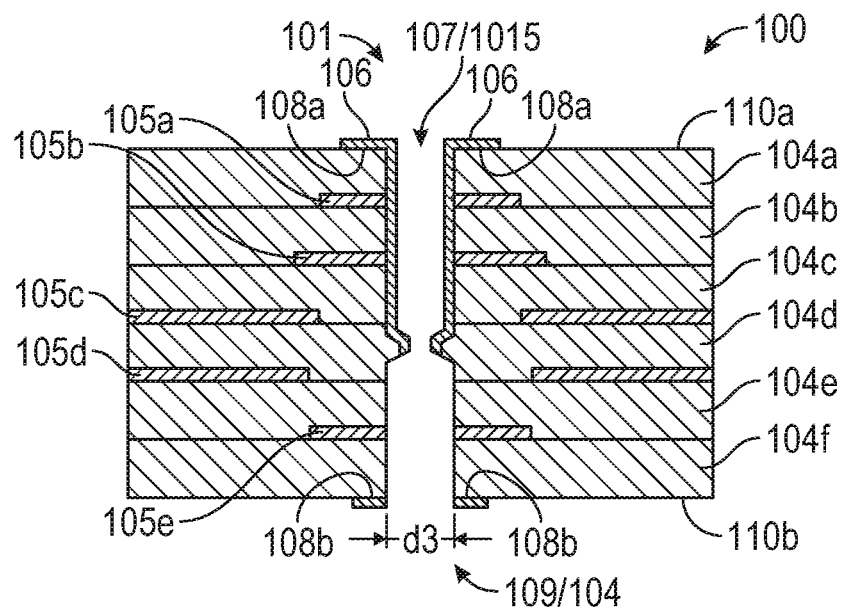
Figures 1, 2, 2A:
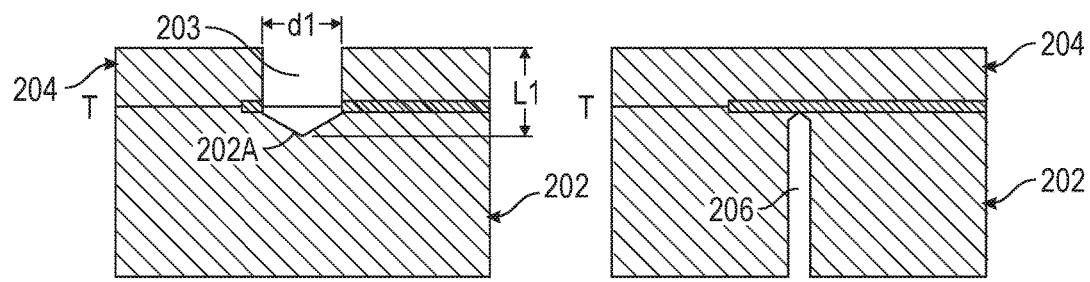
FIGS. 2A1, 2A2 and 2B-2D illustrate the different fabrication stages for forming a plated through hole (or via) and removal of a long stub in a printed circuit board (PCB), according to one aspect.

As the relative drill accuracy to PCB layers can depend on the drill depth length, drilling a hole having shorter depth provides better accuracy then drilling a hole having a longer depth. As shown in FIG. 2A-1, the upper hole 203 is formed using the short depth drill and has a diameter of d1 and a depth length L1, such that the bottom of the upper hole 203a is below the target layer T. In other words, the short depth drill passes through the target layer T when drilling from the second layer 204 downward.

Figures 2B, 2C:
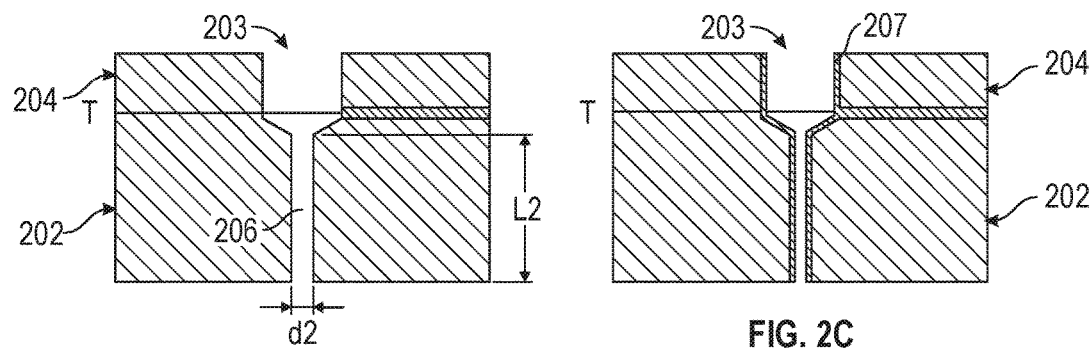
Figure 2D:
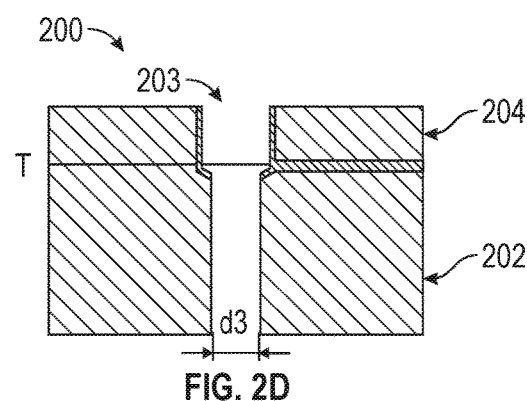

Next, as shown in FIG. 2B, the long depth drill may be used to drill a lower hole 206 up to and through the upper hole 203 forming a complete hole through the PCB, or the long depth drill is performed downward from hole 203 to the other PCB surface. The lower hole 206 has a diameter d2 and a length L2 where d2 is less than d1 and L2 is greater than L1.

Alternatively, as shown in FIG. 2A-2, the lower hole 206 may be drilled first, using the long depth drill, up to the Target Layer T. Next, the small depth drill may be used to drill the upper hole 203 such that it connects with the lower hole 206 at or below the target layer T. (See FIG. 2B)

After the dual diameter hole (i.e. the upper hole 203 having a diameter d1 and lower hole 206 having a diameter d2) has been formed, the dual diameter hole may then be plated by a conductive material 207. (See FIG. 2C) Next, a middle drill, having a diameter d3, where d3 is greater than d2 but less than d1, may be used to remove plated conductive material from the surface of the lower hole 206 by drilling down through the upper hole 203 and drilling the conductive material on the lower hole 206.

Referring to FIGS. 3A-3G, different fabrication stages for forming a plated through hole (or via) 300 (FIG. 3G) in a printed circuit board (PCB) 301 are illustrated. The PCB 301 has an upper surface 301a and an opposing lower surface 301b. The through hole 300 has an upper conductive portion 302 and a lower non-conductive portion 304.

A three (3) drill step process may be used to form the plated through hole 300. In the first step, a first hole 306 is drilled, from the upper surface 301a of the PCB, using a first drill 308 having a first diameter d1. The first hole 306 is drilled to a predetermined depth, such as just past a target layer T in the PCB 301. (See FIGS. 3A and 3B)

Next, a second hole 310 may be drilled, using a second drill 312 having a second diameter d2, where d2 is smaller than d1. (See FIGS. 3C, and 3D) The interior surface of the holes 306 and 310 may then be plated 311 with a conductive material. (FIGS. 3E and 3F)

Figure 3A:
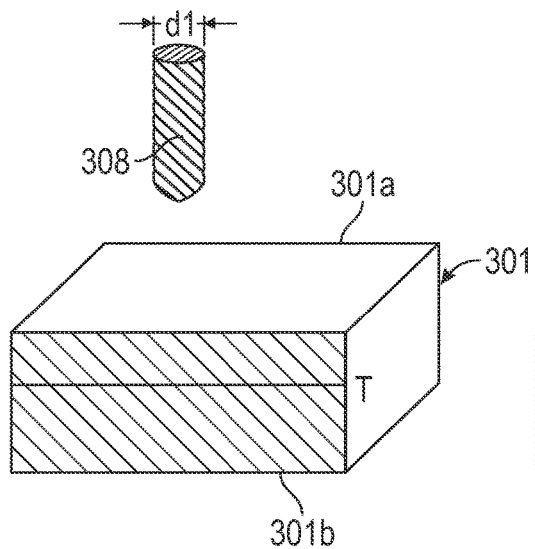
FIGS. 3A-3G are illustrations of the different fabrication stages for forming a plated through hole (or via) and removal of a long stub in a printed circuit board (PCB), according to one aspect.
Figure 3B:
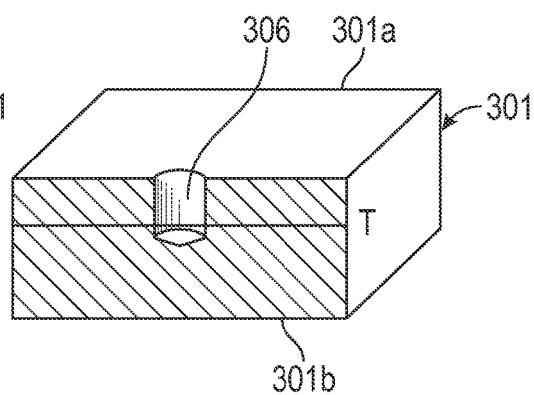
Figure 3C:
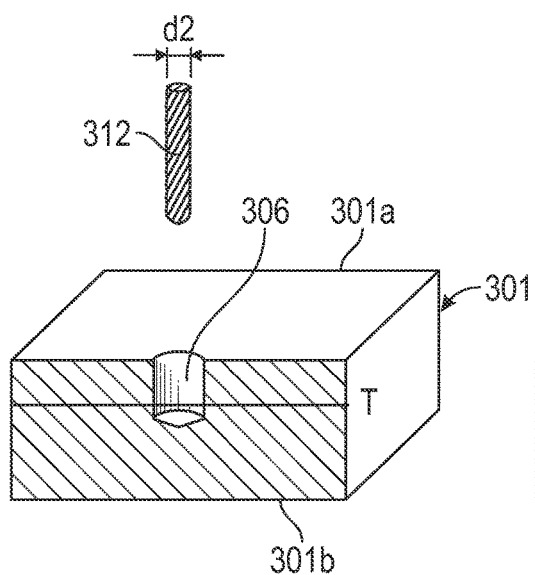
Figure 3D:
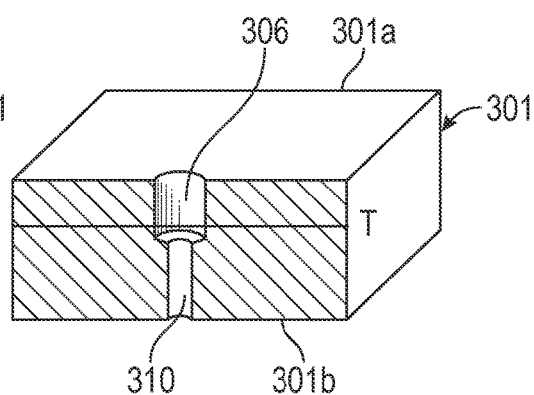
Figures 3E, 3F:
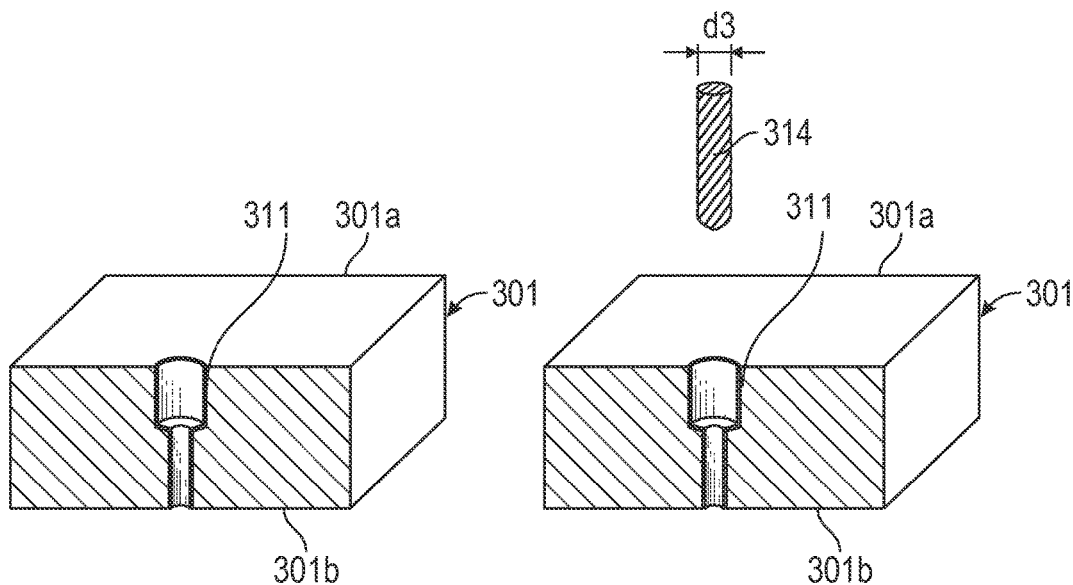
Figure 3G:
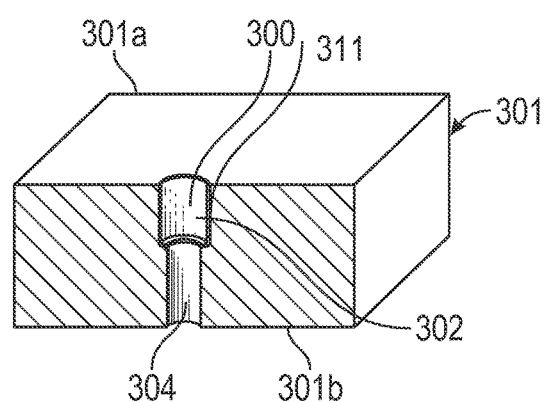
Figure 4A:
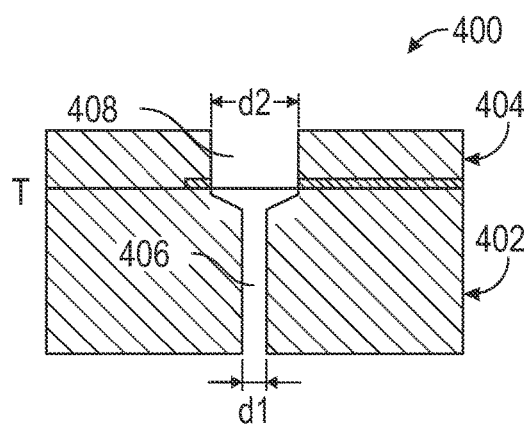
FIGS. 4A-4D are illustrations of the different fabrication stages for forming a plated through hole (or via) and removal of a long stub in a printed circuit board, according to one aspect.
Figure 4B:
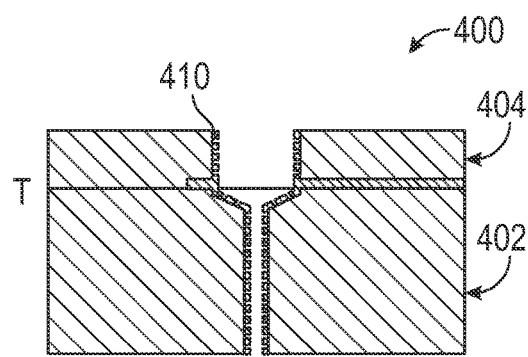
Figure 4C:
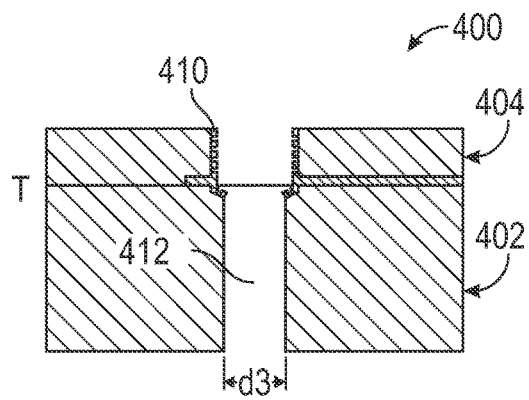
Figure 4D:
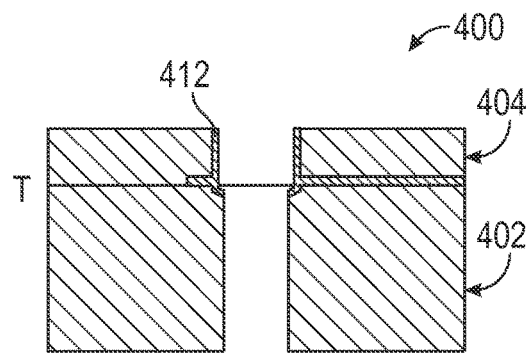
Figure 5A:
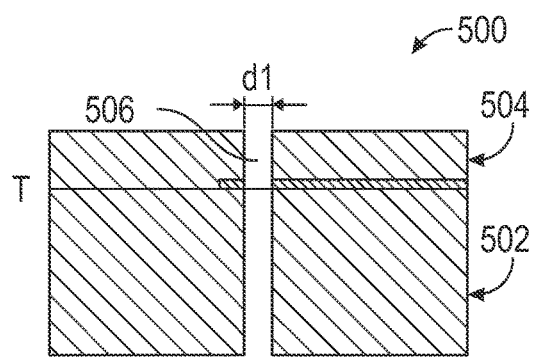
FIGS. 5A-5D illustrate the different fabrication stages for forming a plated through hole (or via) and removal of a long stub in a printed circuit board, according to one aspect.
Figure 5B:
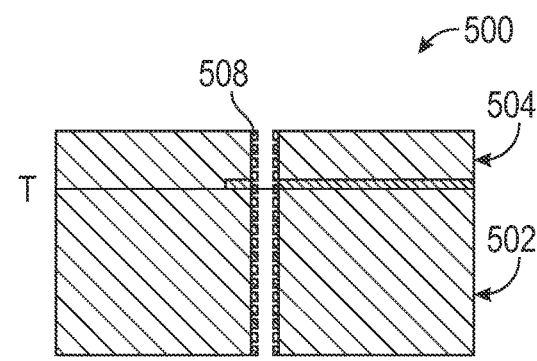
Figure 5C:
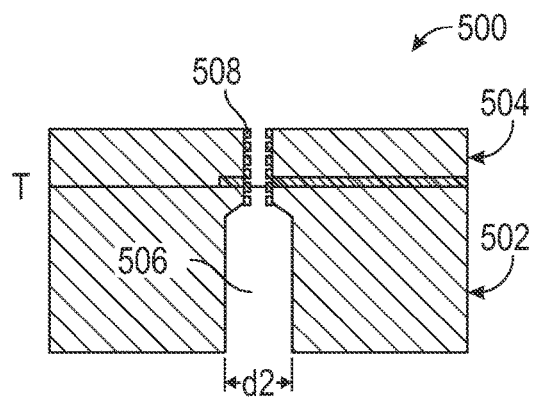
Figure 5D:
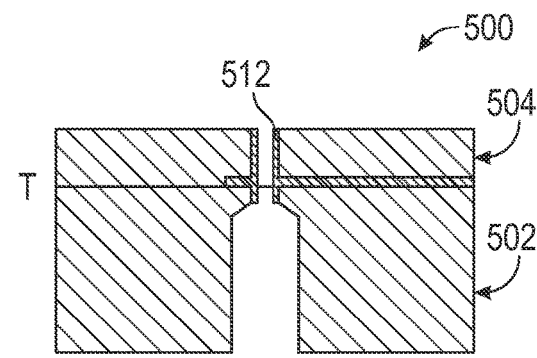

Referring to FIG. 3F, after the first and second holes 306 and 310 are plated 311, a third drill 314, having a third diameter d3, may pass (drill) through the first and second holes 306 and 310. The third diameter d3 is larger than the second diameter d2 but smaller than the first diameter d1. As the third drill 314 has a larger diameter then the second hole 310 but a smaller diameter than the first hole 306, the conductive material 311 in the first hole 306 may be left intact but the conductive material on the second hole 310 is removed, i.e. the stub area is removed. As a result, the through hole 300, as shown in FIG. 3G, has an upper conductive portion 302 and a lower non-conductive portion 304.

Alternatively, the sequence of the first and second drill processes described above can be changed. In the first step, a first hole 310 may be drilled, from the lower surface 301b of the PCB, using a first drill 312 having a first diameter d1. The first hole 310 may be drilled to a predetermined depth, such as just before the target layer in PCB 301 or drilled through the entire PCB 301, such as shown in FIG. 2A-2.

Next, a second hole 306 may be drilled, from the upper surface 301a of the PCB, using a second drill 308 having a second diameter d2, where d2 is larger than d1 (See FIG. 2B) The interior surface of the holes 306 and 310 may then be plated 311 with a conductive material. (FIGS. 3E and 3F)

Referring to FIG. 3F, after the first and second holes 306 and 310 are plated 311, a third drill 314, having a third diameter d3, may pass (or drill) through the holes first and second 306 and 310. The third diameter may be larger than the second diameter d2 but smaller than the first diameter d1. As the third drill 314 has a larger diameter then the second hole 310 but a smaller diameter than the first hole 306, the conductive material 311 in the first hole 306 may be left intact while the conductive material on the second hole 310 is removed, i.e. the stub area is removed. As a result, the through hole 300, as shown in FIG. 3G, may include an upper conductive portion 302 and a lower non-conductive portion 304.

FIGS. 4A-4D illustrate the different fabrication stages for forming a plated through hole (or via) and removal of a long stub in a printed circuit board, according to one aspect. The location where a signal goes through the PTH, or where a first layer 402 is connected to a second layer 404 in the PCB 400, may be represented as a target layer (T). According to one aspect, the first layer 402 may include a first hole 406, having a diameter d1, that is drilled through the first and second layers 402, 404 and a second hole 408, having a diameter d2, where d2 is greater than d1, may be drilled from the top surface of the board 400 to slightly below the target conductive layer T. A seeding conductive material 410, such as electroless copper plating, is applied to the first hole 406 and the second hole 408. A third hole 412, having a diameter d3, which is greater than d1 but less than d2, is back drilled to slightly below the target layer T. As d3 is greater than d1, the seeding conductive material 410 in the second hole 408 is removed upon drilling the third hole 412. Next, electrolytic plating 414 is then applied to the second hole 408.

FIGS. 5A-5D illustrate the different fabrication stages for forming a plated through hole (or via) and removal of a long stub in a printed circuit board, according to one aspect. The location where a signal goes through the PTH, or where a first layer 502 is connected to a second layer 504 in the PCB 500, is represented as a target conductive layer (T). According to one aspect, the first layer 502 may include a first hole 506, having a diameter d1, drilled through the first and second layers 502, 504. A seeding conductive material 508, such as electroless copper plating, is then applied to the first hole 506. Next, a second hole 510, having a diameter d2, where d2 is greater than d1, is back drilled to slightly below the target conductive layer T. After back drilling the second hole 510, electrolytic plating 512 is then applied to the first hole 506.

Figure 6:
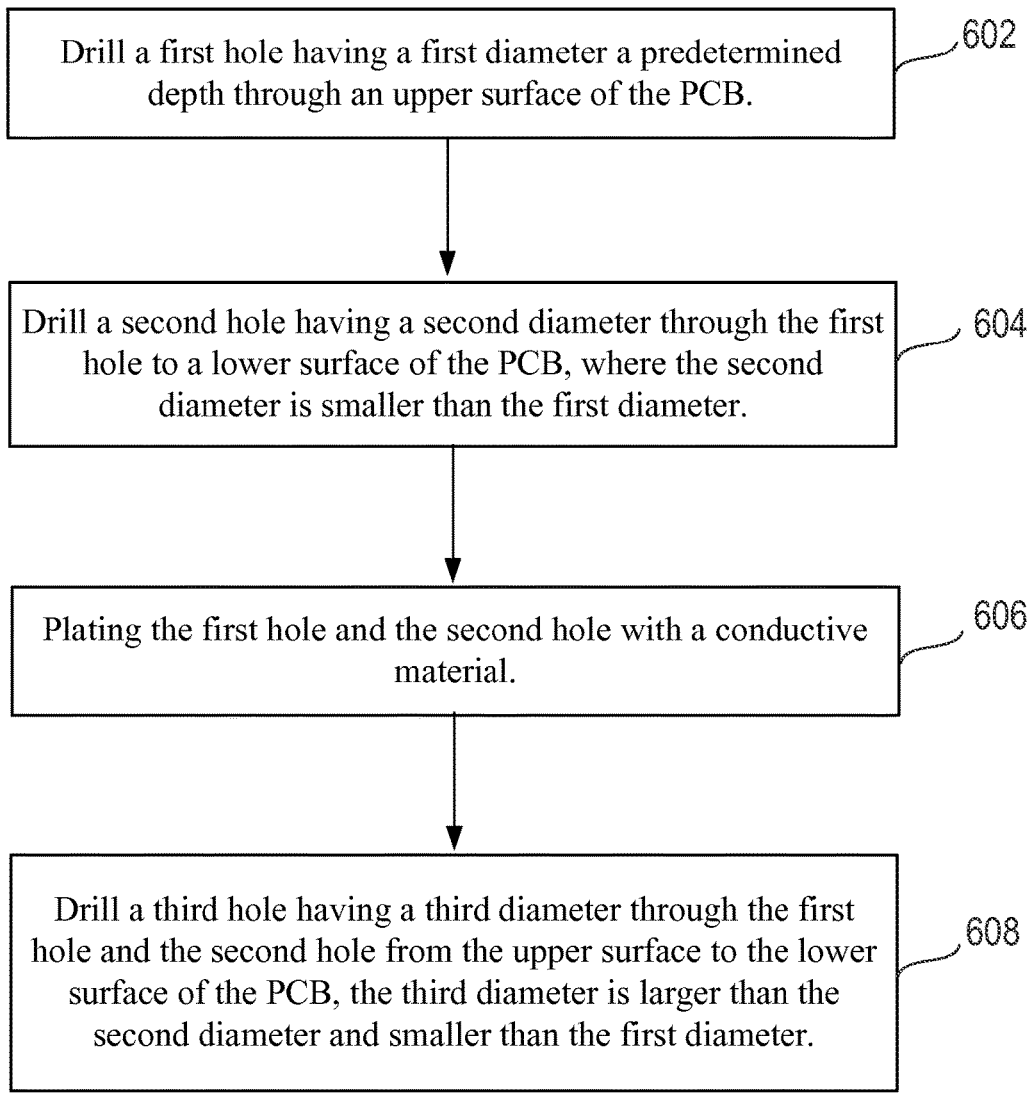
FIG. 6 illustrates a method for forming a plated through hole and removing a long stub in a laminated PCB, according to one aspect.

FIG. 6 illustrates a method for forming a plated through hole and removing a long stub in a laminated PCB, according to one aspect. In the method, a first hole, having a first diameter, may be drilled, from an upper surface of the PCB, a predetermined depth in a printed circuit board using a first drill having a first diameter 602. For example, the predetermined depth may be half way through the PCB. Next, a second hole, having a second diameter, may be drilled through the remaining portion of the PCB to the lower surface of the PCB 604 creating or forming a through hole. The second diameter may be smaller than the first diameter. Next, the first hole and the second hole may be plated with a conductive material 606. Next, a third hole having a third diameter may be drilled through the first hole and the second hole from the upper surface to the lower surface of the PCB, the third diameter is larger than the second diameter and smaller than the first diameter 608. As the third diameter is larger than the second diameter and smaller than the first diameter, when the third hole is drilled the plated material may be removed from the inner surface of the second hole. That is, the stub may be removed. As a result, a through hole having an upper conductive portion and a lower non-conductive portion is formed.

Figure 7:
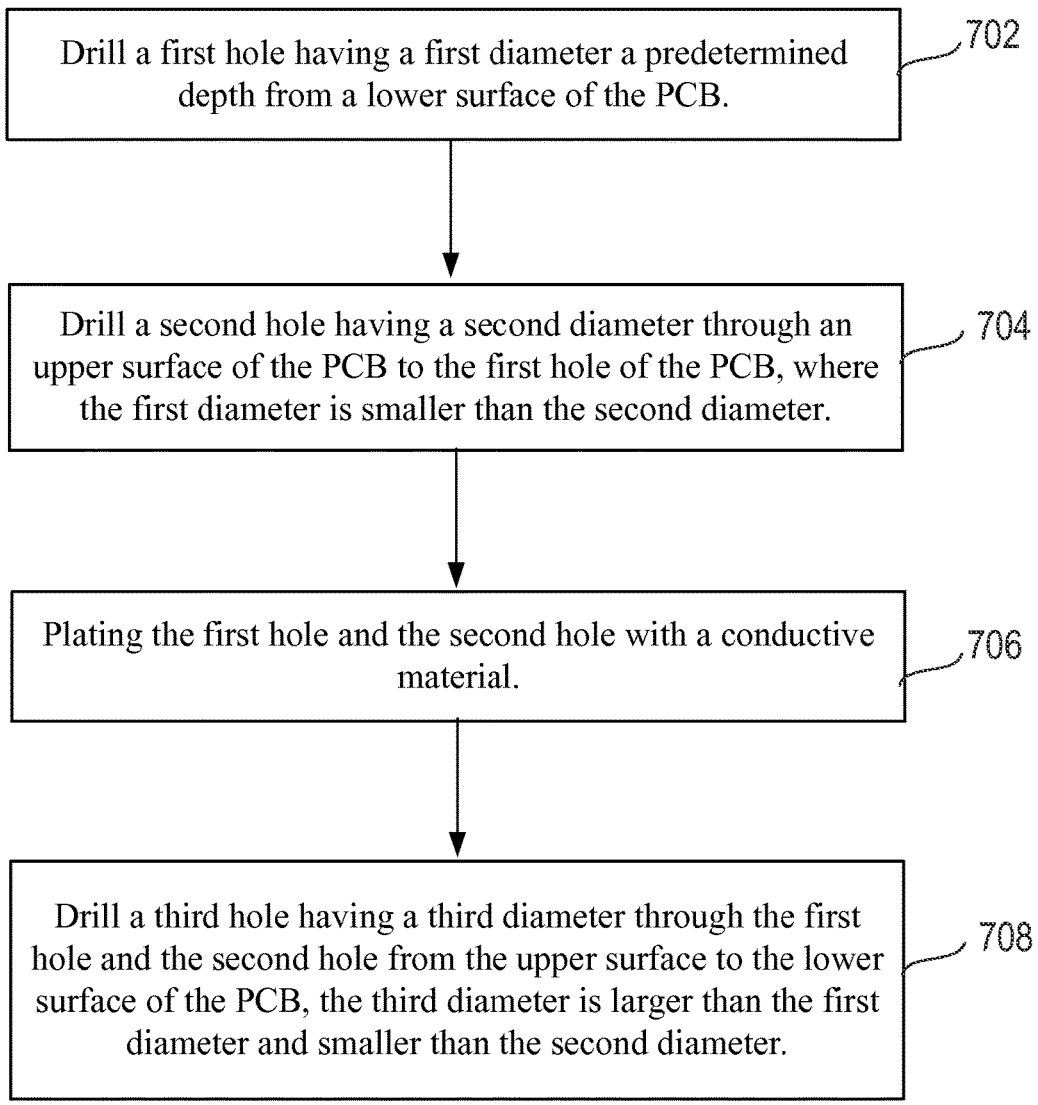
FIG. 7 illustrates a method for forming a plated through hole and removing a long stub in a laminated PCB, according to one aspect.

In another aspect, FIG. 7 illustrates a method for forming a plated through hole and removing a long stub in a laminated PCB, according to one aspect. In the method, a first hole, having a first diameter, may be drilled, from a lower surface of the PCB, a predetermined depth in a printed circuit board using a first drill having a first diameter 702. For example, the predetermined depth may be half way through the PCB. Next, a second hole having a second diameter may be drilled through an upper surface of the PCB to the first hole of the PCB 704. The first diameter is smaller than the second diameter. Next, the first hole and the second hole may be plated with a conductive material 706. Next, a third hole having a third diameter may be drilled through the first hole and the second hole from the upper surface to the lower surface of the PCB, the third diameter is smaller than the second diameter and larger than the first diameter 708. As the third diameter is smaller than the second diameter and larger than the first diameter, when the third hole is drilled the plated material may be removed from the inner surface of the first hole. That is, the stub is removed. As a result, a through hole having an upper conductive portion and a lower non-conductive portion is formed.

Figure 8:
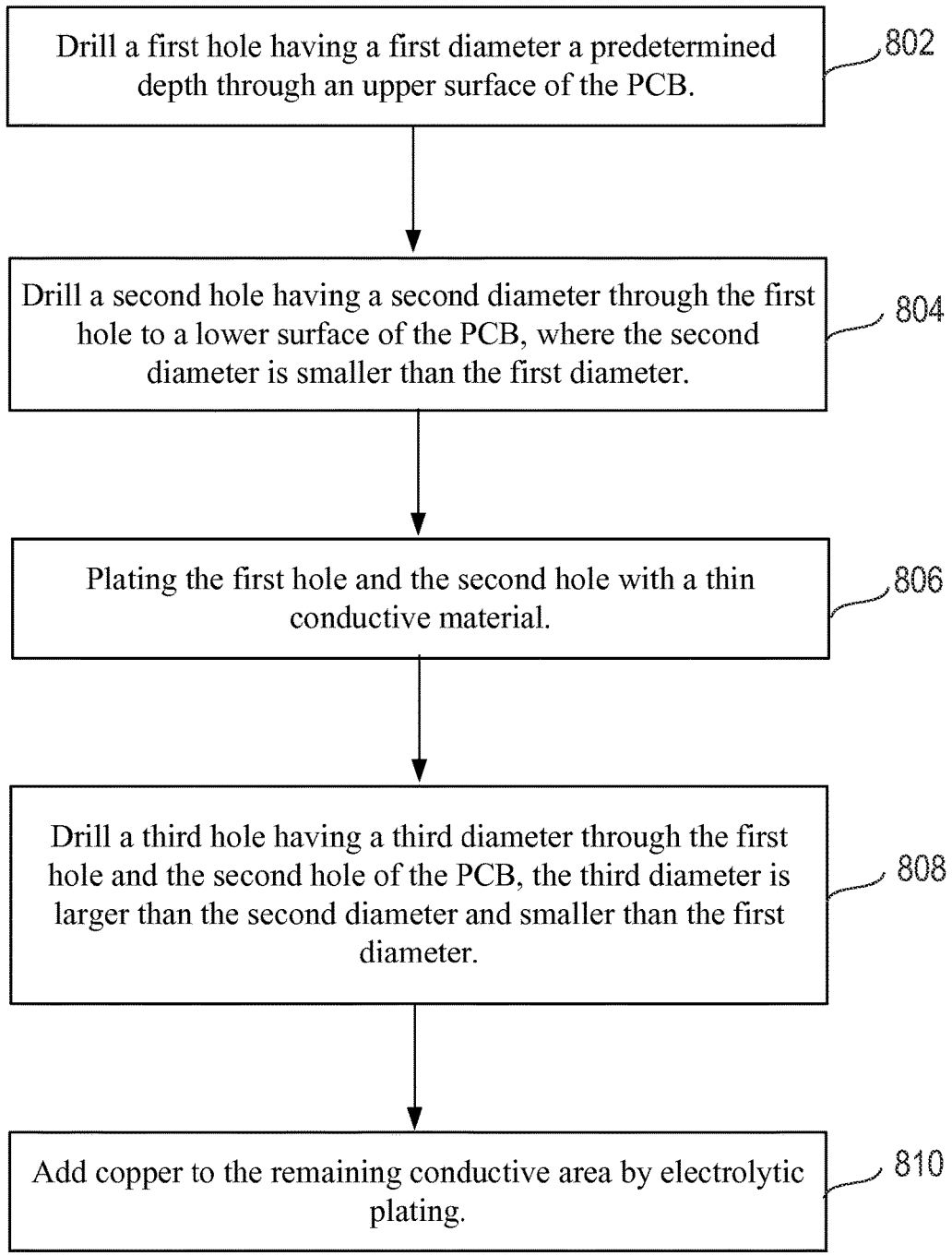
FIG. 8 illustrates a method for forming a plated through hole and removing a long stub in a laminated PCB, according to one aspect.

In yet another aspect, FIG. 8 illustrates a method for forming a plated through hole and removing a long stub in a laminated PCB, according to one aspect. A first hole, having a first diameter, may be drilled, from an upper surface of the PCB, a predetermined depth in a printed circuit board using a first drill having a first diameter 802. For example, the predetermined depth may be half way through the PCB. Next, a second hole having a second diameter may be drilled through the first hole to the lower surface of the PCB 804. The second diameter is smaller than the first diameter. Next, the first hole and the second hole may be plated with a thin conductive material such as electroless plating catalyst or electroless copper 806. Next, a third hole having a third diameter may be drilled through the first hole and the second hole of the PCB, the third diameter is larger than the second diameter and smaller than the first diameter 808. A conductor, such as copper, may then be added to the remaining conductive area by electrolytic plating 810. As the third diameter is larger than the second diameter and smaller than the first diameter, the third hole may prevent plating up of the conductive material so as to remove the thin base conductor, for electrolytic plating, from the inner surface of the first hole. That is, the stub may be prevented. As a result, a through hole having an upper conductive portion and a lower non-conductive portion may be formed.

Figure 9:
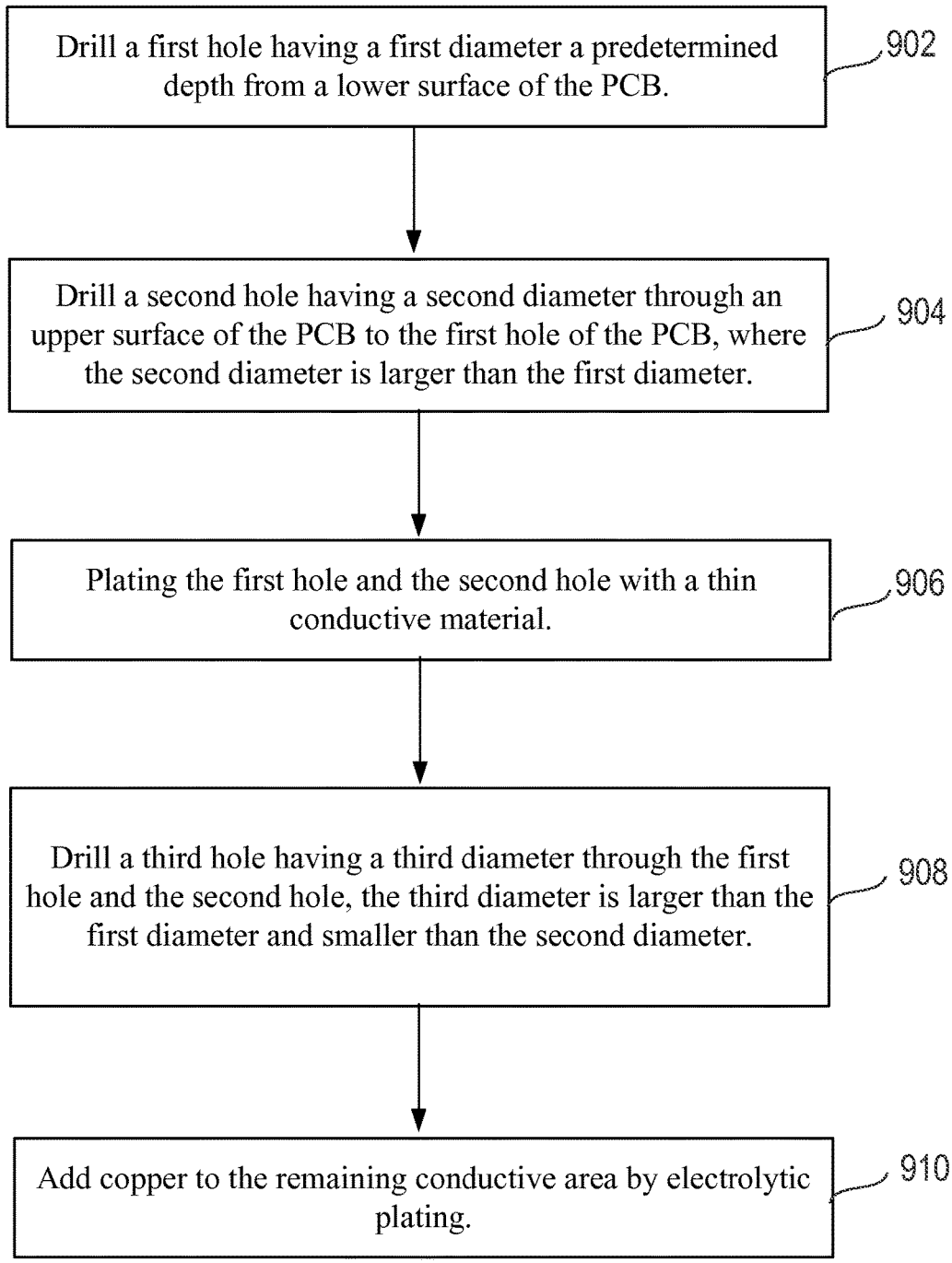
FIG. 9 illustrates a method for forming a plated through hole and removing a long stub in a laminated PCB, according to one aspect.

In yet another aspect, FIG. 9 illustrates a method for forming a plated through hole and removing a long stub in a laminated PCB, according to one aspect. In the method, a first hole, having a first diameter, may be drilled, from a lower surface of the PCB, a predetermined depth in a printed circuit board using a first drill having a first diameter 902. For example, the predetermined depth may be half way through the PCB. Next, a second hole having a second diameter may be drilled through an upper surface of the PCB to the first hole of the PCB 904. The second diameter is larger than the first diameter. Next, the first hole and the second hole may be plated with a thin conductive material such as electroless plating catalyst or electroless copper 906. Next, a third hole having a third diameter may be drilled through the first hole and the second hole of the PCB, the third diameter may be larger than the first diameter and smaller than the second diameter 908. A conductor, such as copper, may then be added to the remaining conductive area by electrolytic plating 910. As the third diameter is larger than the first diameter and smaller than the second diameter, the third hole may prevent plating up of the conductive material so as to remove the thin base conductor, for electrolytic plating, from the inner surface of the first hole. That is, the stub generation may be prevented. As a result, a through hole having an upper conductive portion and a lower non-conductive portion may be formed.

Removal of Short Stub

Referring to FIGS. 10A-10G, the different fabrication stages for forming a plated through hole (or via) 1000 in a laminated printed circuit board (PCB) 1001 are illustrated. The PCB 1001 may have an upper surface 1001a and a lower surface 1001b. The through hole 1000 may have an upper conductive portion 1002 and a lower non-conductive portion 1004.

As described below, a three (3) drill step process may be used to form the plated through hole. In the first step, a first hole 1006 may be drilled, i.e. from the lower surface 1001b of the PCB, to a predetermined depth using a first drill 1008 having a first diameter d1. The first hole 1006 may be drilled just past the target layer in the PCB 1001. (See FIGS. 10A and 10B)

Next, a second hole 1010 may be drilled, from the upper surface 1001a to the top of the first hole 1006, using a second drill 1012 having a second diameter d2, where d2 is larger than d1. (See FIGS. 10C and 10D) The interior surface of the holes 1006 and 1010 may be then plated with a conductive material 1013. (FIGS. 10E and 10F)

Referring to FIG. 10F, after the first and second holes 1006 and 1000 are plated 1011, a third drill 1014, having a third diameter d3, may pass (drill) through the first and second holes 1006 and 1010. The third diameter is larger than the first diameter d1. As the third drill 1014 has a larger diameter then the first hole 1006 but a smaller diameter than the second hole 1010, the conductive material in the second hole 1010 may be left intact but the majority of the conductive material on the first hole 1006 is removed, i.e. the stub area is removed. As shown in FIG. 10G, the third drill 1014 may not be drilled all the way through the plated first hole 1006 leaving a small portion or small stub 1016 of the conductive material on the inner surface of the first hole 1006. A small stub 1016 may remain because when drilling upwardly from the lower surface 1001b of the PCB, the drill bit has no pressure and creates fluctuating as well as copper peel off. Also, the short depth drill has higher depth accuracy than the long depth drill, so controlling the stub length by using a shorter depth drill may provide shorter stub length than when using a longer depth drill. For instance, this process may provide a shorter stub than when a third drill is drilled from top hole 1010 to bottom hole 1006 as in like FIG. 2 and FIG. 3 which is controlled stub length by the second drill. As a result, the through hole 1000, as shown in FIG. 10G, may have an upper conductive portion 1002, a lower non-conductive portion 1004 and a small stub 1016. (FIG. 10G)

Alternatively, in the first step, a first hole 1010 may be drilled, i.e. from the upper surface 1001a of the PCB, to a predetermined depth using the first drill 1012 having a first diameter d1. The first hole 1010 may be drilled to just before the target layer in the PCB 1001. Next, a second hole 1006 may be drilled, from the lower surface 1001b to the bottom of the first hole 1010, using a second drill 1008 having a second diameter d2, where d2 is smaller than d1. (See FIG. 10D and The interior surface of the holes 1006 and 1010 may then be plated with a conductive material. (FIGS. 10E and 10F)

Referring to FIG. 10F, after the first and second holes 1010 and 1006 are plated 1011, a third drill 1014, having a third diameter d3, may pass (drill) through the first and second holes 1006 and 1010. The third diameter is larger than the second diameter d2. As the third drill 1014 has a larger diameter then the second hole 1006 but a smaller diameter than the hole 1010, the conductive material in the first hole 1010 may be left intact but the majority of the conductive material on the first hole 1006 may be removed, i.e. the stub area is removed. As shown in FIG. 10G, the third drill 1014 is not drilled all the way through the plated first hole 1006 leaving a small portion or small stub 1016 of the plating resist on the inner surface of the first hole 1006. A small stub 1016 may remain because when drilling upwardly from the lower surface 1001b of the PCB, the drill bit has no pressure and creates fluctuating as well as copper peel off. Also, short depth drill has higher depth accuracy than long depth drill, so controlling stub length by shorter depth drill may provide shorter stub length than longer depth drill. For instance, this process may provide a shorter stub than when drilled using the third drill from the second (or top) hole 1010 to the first (or bottom) hole 1006 as in FIG. 2 and FIG. 3 where the stub length is controlled by a long depth second drill. As a result, the through hole 1000, as shown in FIG. 10G, may have an upper conductive portion 1002, a lower non-conductive portion 1004 and a small stub 1016. (See FIG. 10G)

FIGS. 11A1, 11A2 and 11B-11G are illustrations of the different fabrication stages for forming a plated through hole (or via) 1100 and removal of a short stub in a printed circuit board (PCB) 1101, according to one aspect. The printed circuit board has an upper surface 1101a and an opposing lower surface 1101b.

The location where a signal goes through the PTH, or where a first layer 1102 is connected to a second layer 1104 in the PCB 1100, may be represented as a target layer (T). According to one aspect, the first layer 1102 may include an upper hole 1108 drilled using a long depth drill while the second layer 1104 may include a lower hole 1106 drilled using a short depth drill. The long depth drill has a length that is less than or equal to the distance from the bottom of the first layer 1102 to the target layer T prior to plating.

Figures 1, 11A:
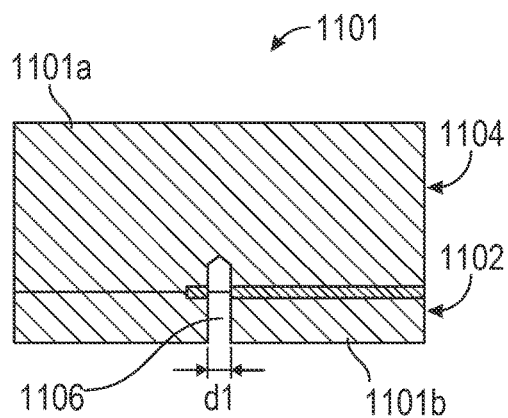
Figures 2, 11A:
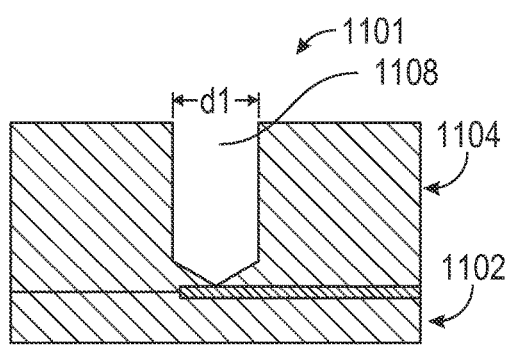
Figures 1, 11B:
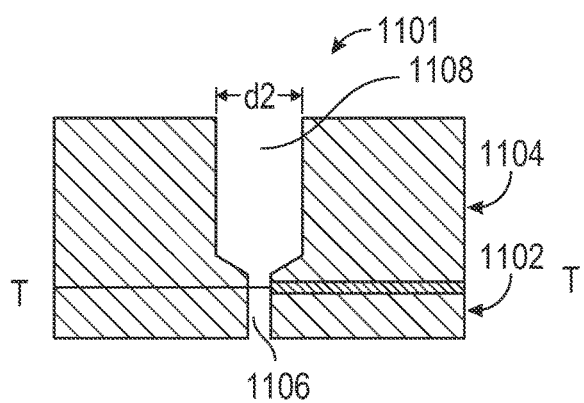
Figures 2, 11B:
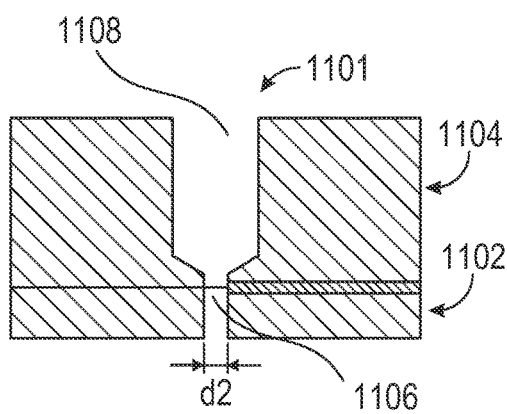
Figure 11C:
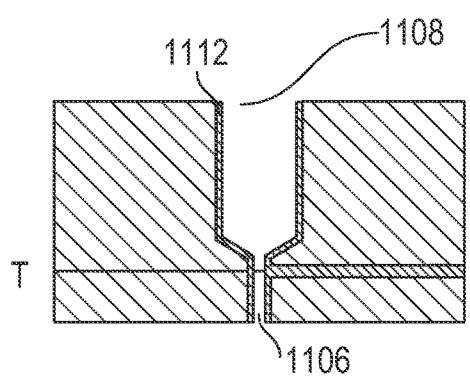

As shown in FIG. 11A-1, the lower hole 1106 may be formed using a short depth drill having a diameter of d1, such that the top of the lower hole 1106 may be just above the target layer T. In other words, the short depth drill passes through the target layer T when drilling from the first layer 1104 upward. Next, the upper hole 1108 may be drilled, from the upper surface 1101a to the top of the lower hole 1106 using a long depth drill having a diameter of d2, where d2 is larger than d1. (See FIG. 11B-1) The interior surface of the upper and lower holes 1108 and 1106 may be then plated 1112 with a conductive material. (FIG. 11C)

Figure 11D:
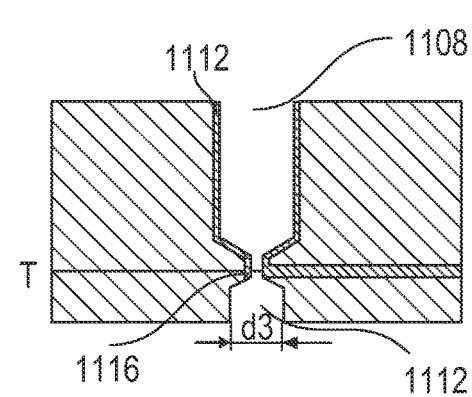

After the upper and lower holes 1110 and 1106 are plated 1112, a third hole 1114, having a diameter d3, which is greater than d1 but less than d2, is back drilled to slightly below the target layer T. As d3 is greater than d1, the conductive material 1112 in the upper hole 1108 may be left intact but the majority of the conductive material on the lower hole 1106 may be removed, i.e. the stub area is removed. As shown in FIG. 11D, the third hole 1114 is not drilled, all the way through the plated lower hole 1106 leaving a small portion or small stub 1116 of the plating resist on the inner surface of the first hole 1106. A small stub 1116 may remain because when drilling upwardly from the lower surface 1101b of the PCB, the drill bit has no pressure and creates fluctuating as well as copper peel off. Also, a short depth drill has higher depth accuracy than long depth drill, so controlling stub length by shorter depth drill may provide shorter stub length than longer depth drill. For instance, this process may provide a shorter stub than when drilled with the third drill from upper hole 1110 to lower hole 1106 as in FIG. 2 and FIG. 3 where the stub length is controlled by a long depth second drill. As a result, the through hole 1100, as shown in FIG. 11D may have an upper conductive portion, a lower non-conductive portion and a small stub 1116.

Alternatively, as shown in FIG. 11A-2, the upper hole 1108 may be drilled first, using the long depth drill, down to the Target Layer T. Next, the small depth drill may be used to drill the upper hole 1108 such that it connects with the lower hole 1106 at or below the target layer T. Next, the lower hole 1106 may be drilled, from the lower surface 1101b to the bottom of the lower hole 1106 using a short depth drill having a diameter of d2, where d2 is smaller than d1. (See FIG. 12B-2) The interior surface of the upper and lower holes 1108 and 1106 may be then plated 1112 with a conductive material. (FIG. 11C)

After the upper and lower holes 1110 and 1106 are plated 1112, a third hole 1114, having a diameter d3, which is greater than d1 but less than d2, is back drilled to slightly below the target layer T. As d3 is greater than d1, the conductive material 1112 in the upper hole 1108 may be left intact but the majority of the conductive material on the lower hole 1106 may be removed, i.e. the stub area is removed. As shown in FIG. 11D, the third hole 1114 is not drilled, all the way through the plated lower hole 1106 leaving a small portion or small stub 1116 of the plating resist on the inner surface of the first hole 1106. A small stub 1116 may remain because when drilling upwardly from the lower surface 1101b of the PCB, the drill bit has no pressure and creates fluctuating as well as copper peel off. Also, a short depth drill has higher depth accuracy than long depth drill, so controlling stub length by shorter depth drill may provide shorter stub length than longer depth drill. For instance, this process may provide a shorter stub than when drilled with the third drill from upper hole 1110 to lower hole 1106 as in FIG. 2 and FIG. 3 where the stub length is controlled by a long depth second drill. As a result, the through hole 1100, as shown in FIG. 11D may have an upper conductive portion, a lower non-conductive portion and a small stub 1116.

Figure 12:
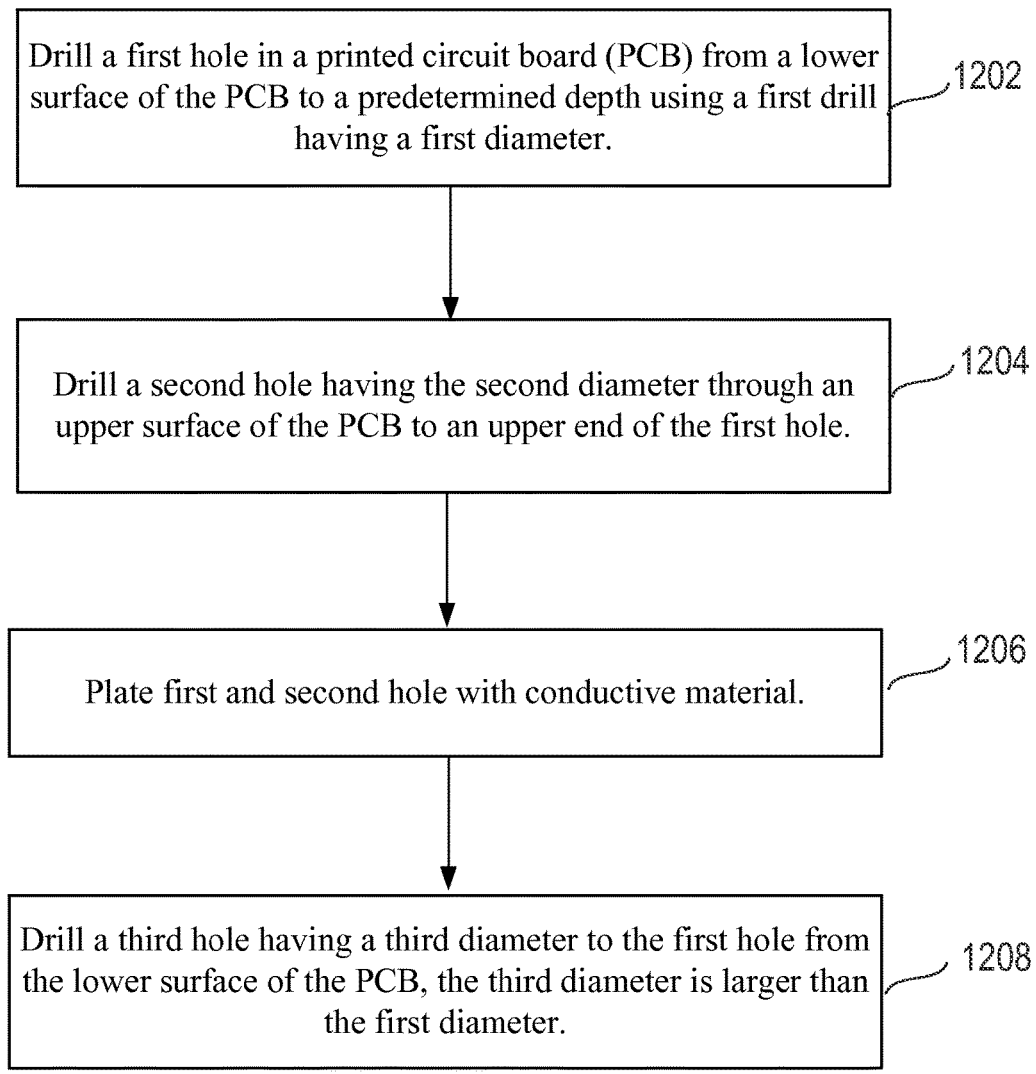
FIG. 12 illustrates a method for forming a plated through hole in a laminated PCB, according to one aspect.

FIG. 12 illustrates a method for forming a plated through hole in a laminated PCB, according to one aspect. In the method, a first hole, having a first diameter, may be drilled from a lower surface of the PCB to a predetermined depth using a first drill having a first diameter 1202. For example, the predetermined depth may be half way through the PCB. Next, a second hole may be drilled from an upper surface of the PCB to a top of the first hole using a second drill having a second diameter, where the second diameter is larger than the first diameter 1204. The first hole and the second hole may then be plated with a conductive material 1206. Next, a third hole, having a third diameter, may be drilled to the first hole from the lower surface of the PCB using a third drill, where the third diameter is larger than the first diameter 1208. As the third diameter is larger than the first diameter and smaller than the second diameter, when the third hole is drilled the plated material may be removed from the inner surface of the first hole. That is, the stub is removed. As a result, a through hole having an upper conductive portion and a lower non-conductive portion may be formed.

Figure 13:
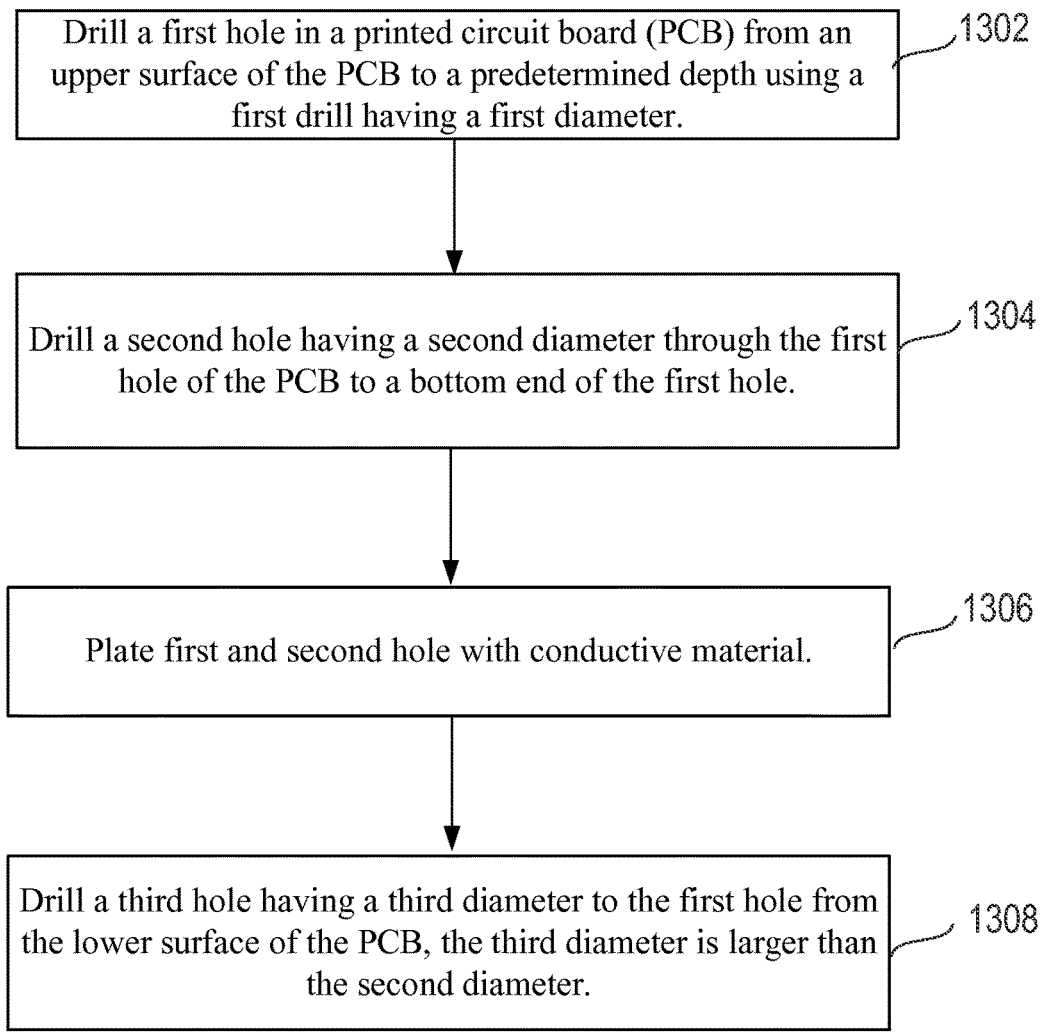
FIG. 13 illustrates a method for forming a plated through hole in a laminated PCB, according to one aspect.

In another aspect, as illustrated in FIG. 13, a first hole, having a first diameter, may be drilled from an upper surface of the PCB to a predetermined depth using a first drill having a first diameter 1302. For example, the predetermined depth may be half way through the PCB. Next, a second hole may be drilled through the first hole of the PCB to a bottom of the first hole using a second drill having a second diameter, where the second diameter is smaller than the first diameter 1304. The first hole and the second hole may then be plated with a conductive material 1306. Next, a third hole, having a third diameter, may be drilled to the first hole from the lower surface of the PCB using a third drill, where the third diameter is larger than the second diameter 1308. As the third diameter is larger than the second diameter, when the third hole is drilled the plated material is removed from the inner surface of the second hole. That is, the stub is removed. As a result, a through hole having an upper conductive portion and a lower non-conductive portion may be formed.

Figure 14:
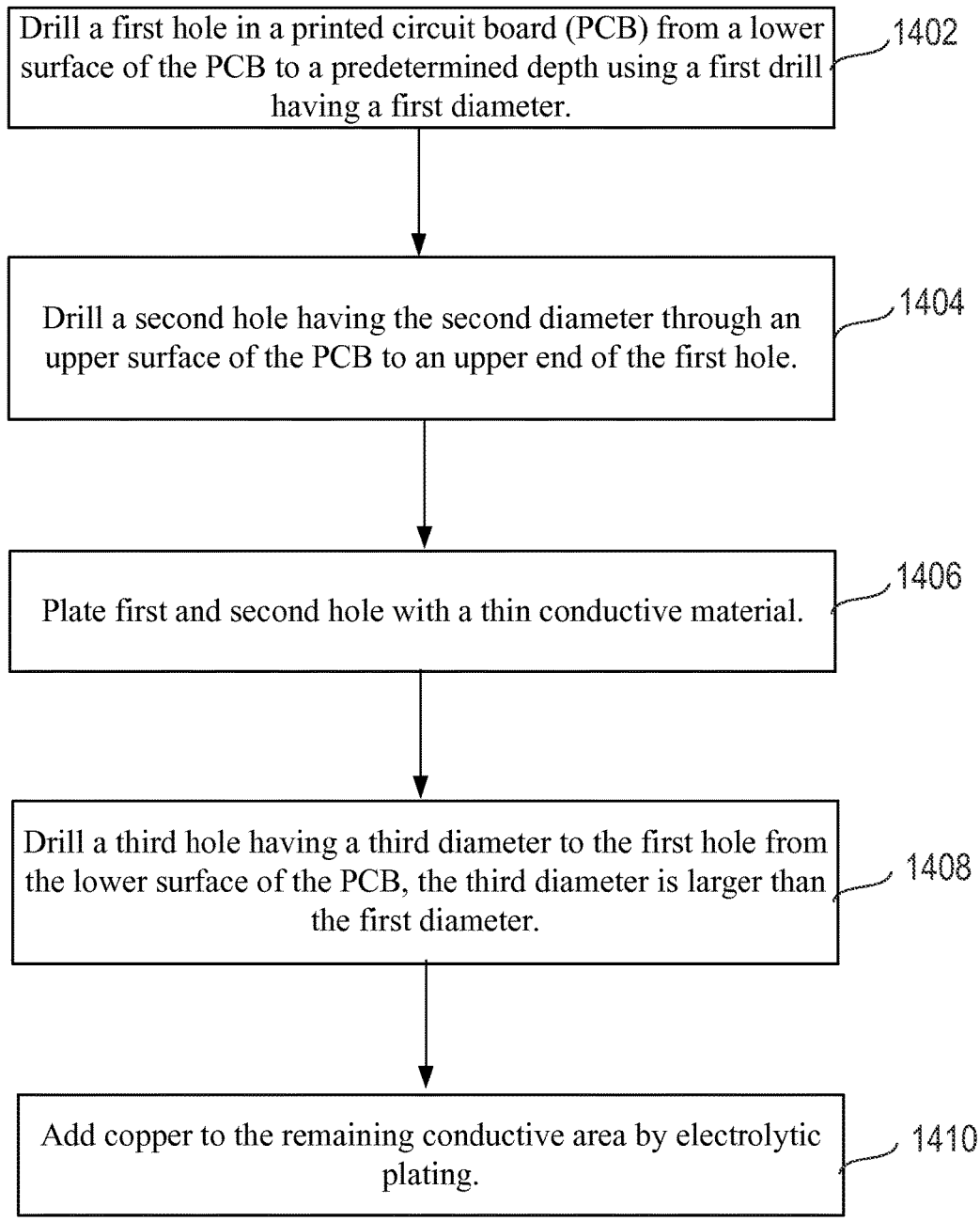
FIG. 14 illustrates a method for forming a plated through hole in a laminated PCB, according to one aspect.

In another aspect, as illustrated in FIG. 14, a first hole may be drilled from a lower surface of the PCB to a predetermined depth using a first drill having a first diameter 1402. For example, the predetermined depth may be half way through the PCB. Next, a second hole may be drilled from an upper surface of the PCB to a top or upper end of the first hole using a second drill having a second diameter, where the second diameter is larger than the first diameter 1404. The first hole and the second hole may then be plated with a thin conductive material such as electroless plating catalyst or electroless copper 1406. Next, a third hole, having a third diameter, may be drilled to the first hole from the lower surface of the PCB using a third drill, where the third diameter may be larger than the first diameter 1408. A conductive material, such as copper, may then be added to the remaining conductive area by electrolytic plating 1410. As the third diameter is larger than the first diameter, when the third hole is drilled the plated material may be removed from the inner surface of the first hole. That is, the stub is removed. As a result, a through hole having an upper conductive portion and a lower non-conductive portion may be formed.

Figure 15:
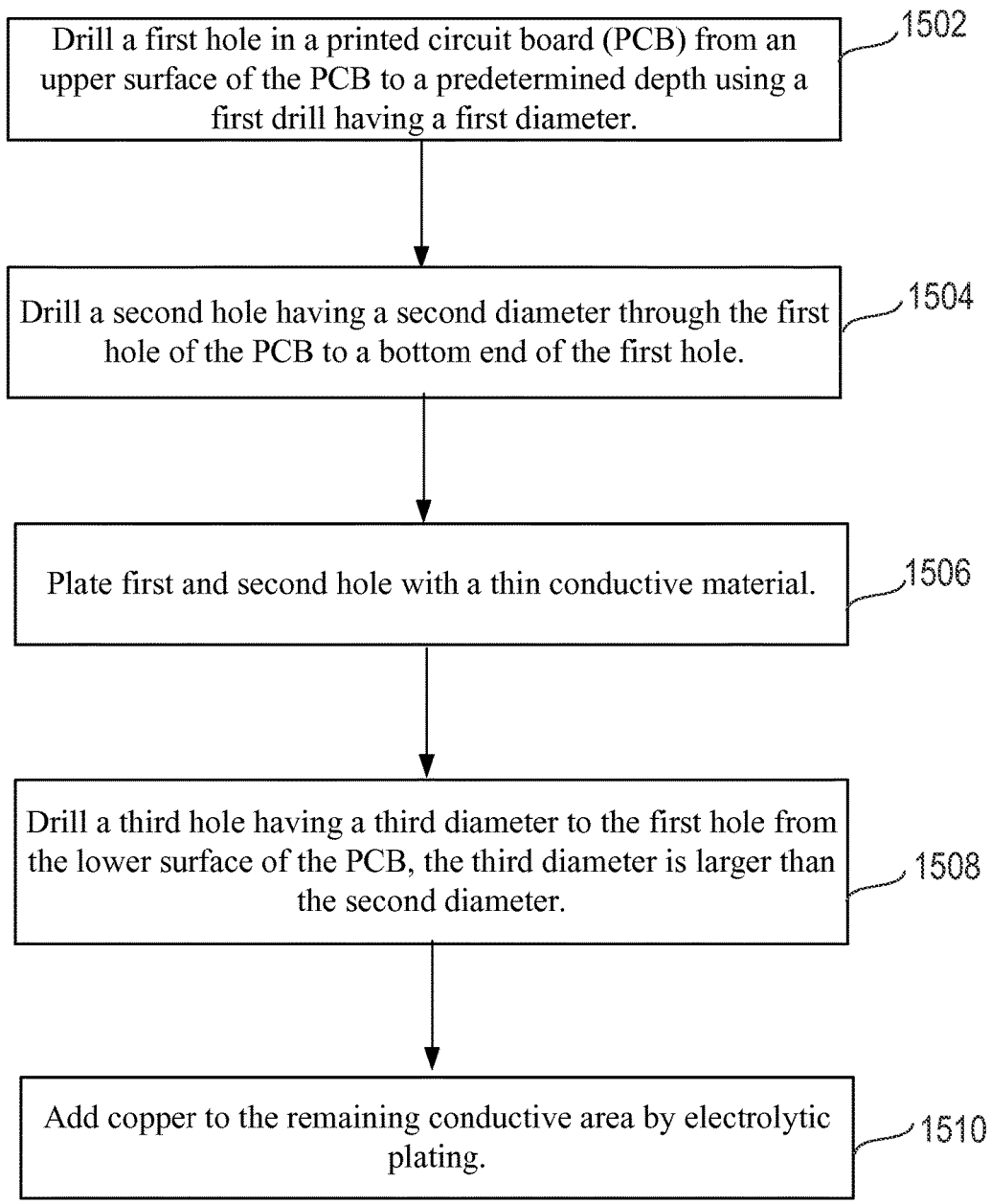
FIG. 15 illustrates a method for forming a plated through hole in a laminated PCB, according to one aspect.
Figure 18E:
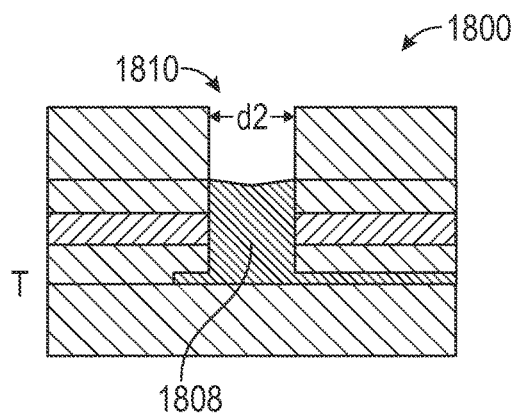
Figure 18F:
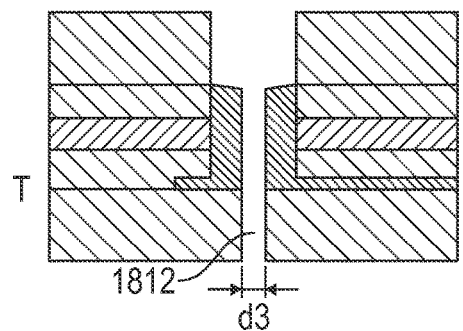
Figure 18G:
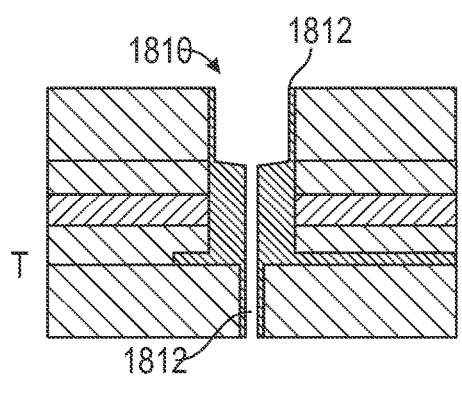
Figure 18H:
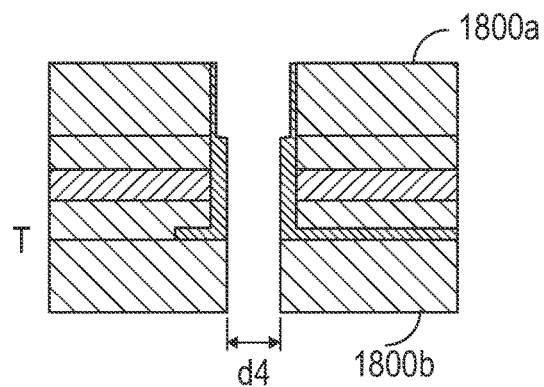
Figure 21E:
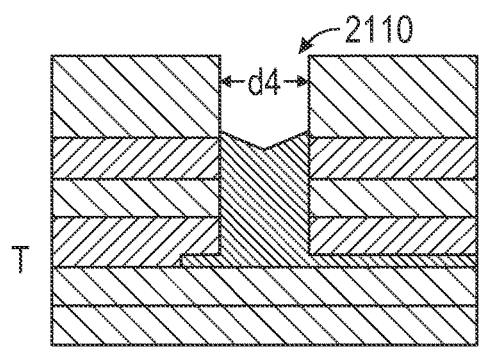
Figure 21F:
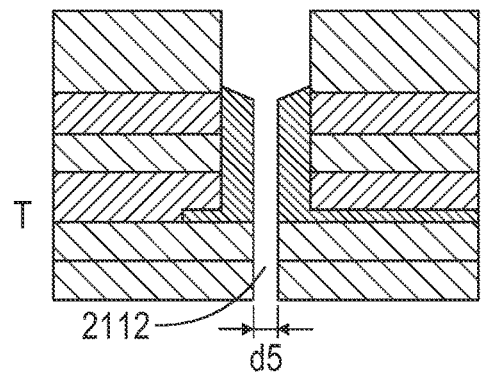
Figure 21G:
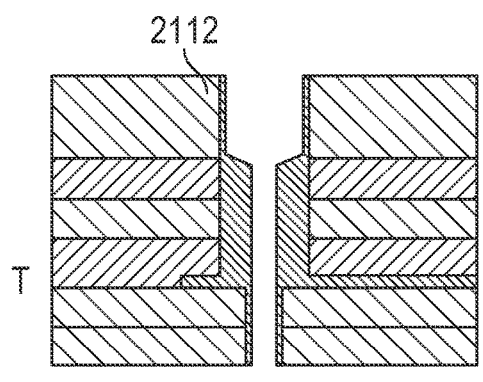
Figure 21H:
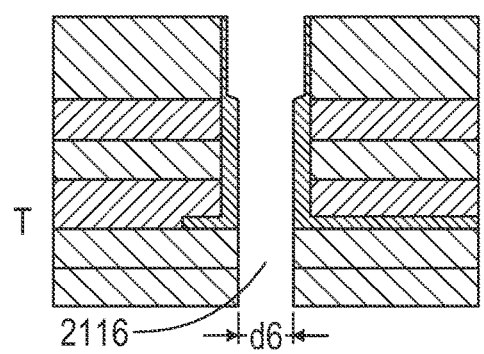

In another aspect, as illustrated in FIG. 15, a first hole is drilled from an upper surface of the PCB to a predetermined depth using a first drill having a first diameter 1502. For example, the predetermined depth is half way through the PCB. Next, a second hole is drilled through the first hole to a bottom of the first hole using a second drill having a second diameter, where the second diameter is smaller than the first diameter 1504. The first hole and the second holes are then plated with a thing conductive material such as electroless plating catalyst or electroless copper 1506. Next, a third hole, having a third diameter, is drilled to the first hole from the lower surface of the PCB using a third drill, where the third diameter is larger than the second diameter 1508. Conductive material, such as copper, is then added to the remaining conductive area by electrolytic plating 1510. As the third diameter is larger than the first diameter and smaller than the second diameter, when the third hole is drilled the plated material is removed from the inner surface of the second hole. That is, the stub is removed. As a result, a through hole having an upper conductive portion and a lower non-conductive portion is formed.

Forming a Via without a Stub

In another aspect, the present disclosure provides a method of using different diameter drills within a PCB and a conductive material filled core having a connecting inner layer trace (target layer) for forming a via without a stub. FIGS. 16A-16H illustrate the different fabrication stages for forming a plated through hole (or via) using different diameter drills within a PCB and a conductive material filled core having a connecting inner layer trace (target layer) for forming a via without a stub, according to one aspect.

In the method, four different drill sizes may be utilized to drill through an upper surface 1600*a* and lower surface 1600*b* of a PCB 1600 passing through embedded conductive material in the PCB 1600. First, a first hole 1602 is drilled in a core 1604 having a diameter of d1 (See FIGS. 16A-16D) and is filled with conductive material 1606, such as conductive paste or plated copper. Next, a second hole 1608, where the second hole 1608 is larger than the first hole 1602, is drilled with diameter of d2 after lamination until reaching the embedded conductive material 1606. Next, a third hole 1610, having a diameter of d3, is drilled by drilling through the second hole 1608, where diameter d3 is smaller than d1 and d2. Next, the second and third holes 1608 and 1610 are plated with a conductive material 1612 such as copper. Next, the plated conductive material is removed from the surface of the third hole 1610 by drilling through the second hole 1608 forming a fourth 1614 having a diameter of d4, where d4 is larger than d3 and smaller than d1 and d2. (See FIGS. 16E-16H)

In another aspect, the present disclosure provides a method of using different diameter drills within a PCB and a conductive material filled core having a connecting inner layer trace (target layer) and adjacent conductive material filled prepreg for forming a via without a stub. FIGS. 17A-17H illustrate the different fabrication stages for forming a plated through hole (or via) using different diameter drills within a PCB and a conductive material filled core having a connecting inner layer trace (target layer) and adjacent conductive material filled prepreg for forming a via without a stub, according to one aspect.

In the method, four different drill sizes may be utilized to drill through an upper surface 1700*a* and lower surface 1700*b* of a PCB 1700 passing through embedded conductive material in the PCB 1700. First, a first hole 1702 is drilled in a core 1704 and prepreg 1706 having a diameter of d1 and filled with conductive material 1708, such as conductive paste or plated copper. Next, a second hole 1710, where the second hole 1710 is larger than the first hole 1702, is drilled having a diameter of d2 after lamination, until reaching the embedded conductive material 1708. Next, a third hole 1712, where the third hole is smaller than the second hole 1710, having a diameter of d3 is drilled by drilling through the second hole 1710, where d3 is smaller than d1 and d2. Next, the second hole 1710 and the third hole 1712 are plated over by a conductive material 1714 such as copper. Next, the plated conductive material is removed from the surface of the third hole 1712 by drilling through the second hole 1710 forming a fourth hole 1716 having a diameter of d4, where d4 is larger than d3 and smaller than d1 and d2. (See FIGS. 17E-17H)

In another aspect, the present disclosure provides a method of using different diameter drills within a PCB and multiple conductive material filled cores having a connecting inner layer trace (target layer) and adjacent conductive material filled prepreg for forming a via without a stub. FIGS. 18A-18H illustrate different fabrication stages for forming a plated through hole (or via) using different diameter drills within a PCB having a conductive material filled prepreg between conductive material filled cores; and having a connecting inner layer trace (target layer) for forming a via without a stub, according to one aspect.

In the method, three different drill sizes may be utilized to drill through an upper surface 1800*a* and lower surface 1800*b* of a PCB 1800 passing through embedded conductive material in the PCB 1800. First, a first hole 1802 is drilled in the core 1804 and prepreg 1806 having a diameter of d1 and filled with conductive material 1808, such as a conductive paste or plated copper 1808. Next, a second hole 1810, having a diameter of d2, is drilled after lamination, until reaching the embedded conductive material 1808. Next, a third hole 1812, having a diameter of d3, is drilled through the second hole 1810, where d3 is smaller than d2 and d1. The second and third holes 1810 and 1812 are then plated over with conductive material 1814, such as copper. Next, plated conductive material is removed from the surface of the third hole 1812 by drilling down through the second hole 1810 forming a fourth hole 1816 having a diameter of d4, where d4 is larger than d3 and smaller than d1 and d2. (See FIGS. 18E-18H)

FIGS. 19A-19G the different fabrication stages for forming a plated through hole (or via) using different diameter drills within a PCB having a conductive material filled prepreg and solid core as well as having a connecting inner layer trace (target layer) for forming a via hole without a stub.

In the method, four different drill sizes are utilized to drill through an upper surface and lower surface of a PCB 1900 passing through embedded conductive material in the PCB 1900. A first hole 1902, having a diameter d1, is drilled in the pregreg 1906 and filled with conductive material 1908 such as conductive paste.

Next, a second hole 1910, having a diameter of d2, is drilled after lamination until reaching the top of the embedded conductive material 1908. Next, a third hole 1912 having a diameter d3 is drilled, where d3 is smaller than d1 and d2. Next, the second hole 1910 and the third hole 1912 are plated over by a conductive material 1914 such as copper. The third hole 1912 is then is back drilled to remove the conductive material from the inner surface of the third hole 1912 and form a fourth hole having a diameter of d4, where d4 is larger than d3 and smaller than d1. (See FIGS. 19E-19G)

FIGS. 20A-20H illustrate the different fabrication stages for forming a plated through hole (or via) using different diameter drills within a PCB having a conductive material filled prepreg 2004 between a conductive material filled core 2006 and a solid core 2008; and a connecting inner layer trace (target layer) for forming a via without a stub.

In the method, five different drill sizes are utilized to drill through an upper surface and lower surface of a PCB 2000 passing through embedded conductive material in the PCB 2000. A first hole 2002 and a second hole 2003 are drilled in the pregreg 2004 and the core 2006 having a diameter of d1 and d2, respectively (FIG. 20A), filled with conductive material 2010, such as conductive paste or plated copper, and an inner layer circuit is formed on the core 2006 (FIG. 20B). Then the cores and prepreg are laminated aligning stacked conductive paste in the core and prepreg to form PCB 2000. (FIG. 20D)

Next, a third hole 2012, having a diameter of d3, is drilled after lamination until reaching the top of the embedded conductive material 2010. Next, a fourth hole 2014 having a diameter d4 is drilled, where d4 is smaller than d3. Next, the third hole 2012 and the fourth hole 2014 are plated over by a conductive material 2016 such as copper. Next, the fourth hole 2014 is back drilled to remove the conductive material and form a fifth hole having a diameter of d5, where d5 is larger than d4 and smaller than d3. (See FIGS. 20E-20H) Alternatively, the fifth drill may be applied after conductive seeding prior to electrolytic plating.

In another aspect, the present disclosure provides a method of using different diameter drills within a PCB and a conductive material filled core having a connecting inner layer trace (target layer) and adjacent conductive material filled prepregs for forming a via without a stub. FIGS. 21A-21H illustrate the different fabrication stages for forming a plated through hole (or via) using different diameter drills within a PCB and multiple conductive material filled cores having a connecting inner layer trace (target layer) and adjacent conductive material filled prepregs for forming a via without a stub.

In the method, six different drill sizes are utilized to drill through an upper surface and lower surface of a PCB 2100 passing through embedded conductive material in the PCB 2100. A hole 2102b, having a diameter d2, is drilled in the core 2104b and holes 2102a and 2102c, having a diameter d1 and d3 respectively, are drilled in the first and second prepregs 2104a and 2104c, and filled with conductive material 2106, such as a conductive paste or plated copper. The core 2104b is formed on a circuit on the surface 2108. The materials are laminated to make a PCB 2100 aligning conductive material filled holes. Next, a fourth hole 2110, having a diameter d4, is drilled after lamination, until reaching the embedded conductive material 2106. Next, a fifth hole 2112, having a diameter d5, is drilled through the PCB 2100 and the embedded conductive material 2108, where the fourth hole 2110 and the fifth hole 2112 are plated over with conductive material 2114, such as copper. Next, the fifth hole 2112 is back drilled to remove the conductive material from the fifth hole 2112, while maintaining the conductive material in the fourth hole 2110, and forming a sixth hole 2116 having a diameter of d6, where d6 is larger than d5 and smaller than d1, d2, d3 and d4. (See FIGS. 21E-21H) Alternatively, back drilling may proceed after conductive seeding for electrolytic plating, such as electroless plating catalyst or electroless copper, prior to electrolytic plating.

Formation of Plated Through Hole with High Aspect Ratio

Referring to FIGS. 22A-22G, the different fabrication stages for forming a plated through hole (or via) 2220 having a high aspect ratio in a printed circuit board (PCB) 2201 are illustrated.

As described below, a three (3) drill step process is used to form the plated through hole. In the first step, a first hole 2206 is drilled, from the lower surface 2201b of the PCB, using a first drill 2208 having a first diameter d1. The first hole 2206 is drilled approximately half way through the PCB 2201. (See FIGS. 22A and 22B) Next, the second drill 2209, having a second diameter d2, is used to drill, from the upper surface 2201a of the PCB, down to a top of the first hole 2206 forming a second hole 2210. An offset 2212 may be created at the end of the second hole 2210 and the beginning of the first hole 2206. The first hole 2206 and the second hole 2210 together form a hole extending through the entire vertical length of the PCB. (See FIG. 22D)

Next, a third drill 2214 is used to drill from the lower surface 2201b upwards (or alternatively the upper surface 2201a downwards) through the first hole 2206 and the second hole 2210. The third drill 2214 has a third diameter d3 which is larger than the first diameter d1 of the first drill 2208 and the second diameter d2 of the second drill 2208. As a result, a smooth hole 2216 is formed that extends through the entire vertical length of the PCB 2201. (See FIGS. 22E-22F) The smooth hole 2216 is then plated 2218 with a conductive material forming a plated through hole 2220. (See FIG. 22G)

Figure 23:
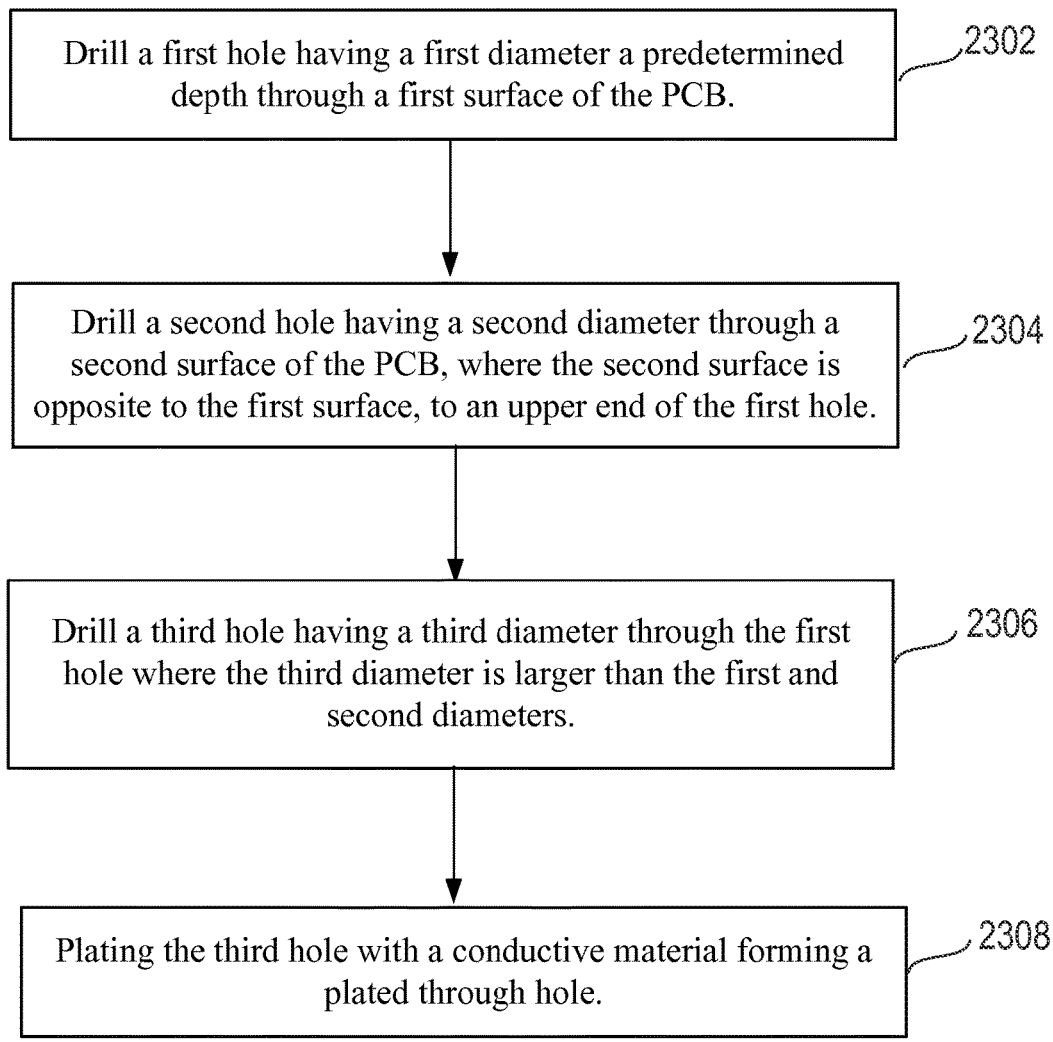
FIG. 23 illustrates a method for forming a plated through hole, having a high aspect ratio, in a PCB, according to one aspect.
Figure 24A:
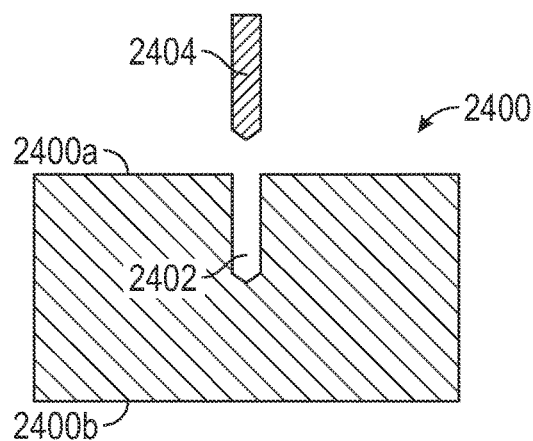
FIGS. 24A-24D illustrate a method of forming a plated through hole, having a high aspect ratio, in a printed circuit board, according to one aspect.
Figure 24B:
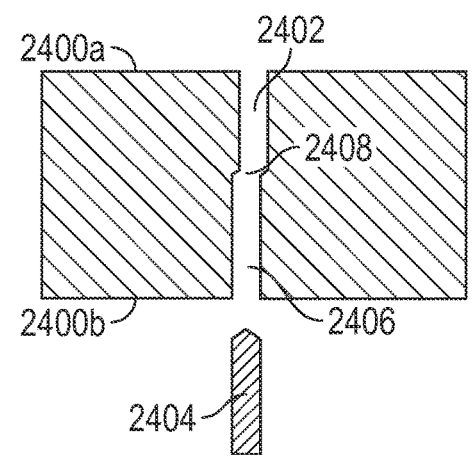
Figure 24C:
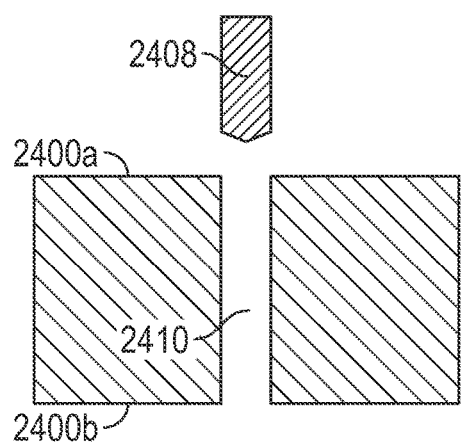
Figure 24D:
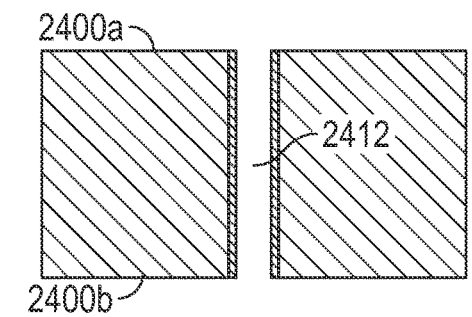

FIG. 23 illustrates a method for forming a plated through hole, having a high aspect ratio, in a PCB, according to one aspect. In the method, a first hole is drilled, from a first surface of the PCB to a predetermined depth using a first drill having a first diameter 2302. For example, the predetermined depth is half way through the PCB. Next, a second hole is drilled, using a second drill having a second diameter, from a second surface of the PCB, the second surface opposite the first surface, to an upper end of the first hole. These holes may create an offset between a lower end of the second hole and the upper end of the first hole due to drill process accuracy 2304. Next, a third hole is drilled, using a drill having a third diameter which is larger than both the first and the second drill diameter, through the first and second holes smoothing the offset between the first and second holes 2306. The third hole is then plated with a conductive material forming a plated through hole 2308.

In another aspect, the present disclosure provides a method of forming a plated through hole, having a high aspect ratio, in a PCB. (See FIGS. 24A-24D) In the method, two different drill sizes may be utilized to drill through an upper surface 2400a and lower surface 2400b of a PCB. First, a first hole 2402 is drilled approximately half way through the PCB 2400 using a first drill 2404. Next, the first drill 2404 is used to drill a second hole 2406 from the bottom surface 2400b of the PCB 2400 to the bottom of the first hole 2402. An offset 2408 is created between the first hole 2402 and the second hole 2406 in the PCB 2400. A second drill 2408, where the second drill 2408 is larger than the first drill 2404 (i.e. has a larger diameter), is then used to drill a third hole 2410 through both the first hole 2402 and the second hole 2406. As the second drill 2408 has a diameter larger than the diameter of the small drill 2404, the first and second holes 2402 and 2406 work as a guide and are smoothed by the large diameter drilling. A conductive material 2412 is then plated on the inner surface of the hole 2410 forming a plated through hole which extends the vertical length of the PCB.

While certain exemplary aspects have been described and shown in the accompanying drawings, it is to be understood that such aspects are merely illustrative of and not restrictive on the broad invention, and that this invention not be limited to the specific constructions and arrangements shown and described, since various other modifications may occur to those ordinarily skilled in the art.

The invention claimed is:

1. A method for forming a plated through hole in a printed circuit board having a second layer on top of a first layer where a target layer connects the second layer to the first layer, the method comprising:
   drilling a first hole having a first diameter a first predetermined depth into an upper surface of the printed circuit board through the second layer past the target layer and into an upper portion of the first layer;
   drilling a second hole having a second diameter through the first hole to a bottom surface of the printed circuit board, the second hole extending from the upper portion of the first layer to the bottom surface of the printed circuit board;
   plating the first hole and the second hole with a conductive material; and
   drilling a third hole having a third diameter from the upper surface downwardly through the first hole and the second hole, where the third diameter is smaller than the first diameter and larger than the second diameter.

2. The method of claim 1, wherein the printed circuit board includes a plurality of plated through holes formed therein using the first hole, the second hole and the third hole in combination as produced in the method of claim 1.

3. The method of claim 1, wherein the first hole is drilled a predetermined depth; and wherein the predetermined depth is shorter than half the vertical distance of the printed circuit board.

4. The method of claim 3, wherein the third hole is drilled from the upper surface to a lower surface of the printed circuit board, the lower surface of the printed circuit board opposing the upper surface of the printed circuit board.

5. The method of claim 1, wherein the second diameter is smaller than the first diameter.

6. The method of claim 5, further comprising adding copper to other conductive surfaces on the printed circuit board by electrolytic plating.

7. The method of claim 5, further comprising adding copper to other conductive surfaces on the printed circuit board by electrolytic plating.

8. The method of claim 1, further comprising:
   embedding a first conductive material in the printed circuit board.

9. A method for forming a plated through hole in a printed circuit board having a first surface and an opposing second surface, comprising:
   embedding a first conductive material in the printed circuit board;
   drilling a first hole having a first diameter from the first surface of the printed circuit board downwardly to a first predetermined depth;
   drilling a second hole having a second diameter from the first surface downwardly through the first hole to a second predetermined depth;
   plating the first hole and the second hole with a second conductive material; and
   drilling a third hole having a third diameter from the first surface downwardly through the first hole and the second hole.

10. The method of claim 9, wherein the printed circuit board has a plurality of plated through holes formed therein using the first hole, the second hole, and the third hole in combination as produced in the method of claim 9; and wherein the first conductive material is copper.

11. The method of claim 9, wherein the first surface is an upper surface and the second surface is a lower surface;
   wherein the first predetermined depth is from the upper surface to the embedded first conductive material;
   wherein the second predetermined depth is from the first surface to the second surface; wherein second diameter is smaller than the first diameter; and
   wherein the third diameter is larger than the second diameter and smaller than the first diameter.

12. The method of claim 9, wherein the second diameter is smaller than the first diameter; and
   wherein the third diameter is smaller than the first diameter and larger than the second diameter.

13. The method of claim 12, further comprising adding copper to other conductive surfaces on the printed circuit board by electrolytic plating.

* * * * *